United States Patent [19]
Hiroki et al.

[11] Patent Number: 5,374,147
[45] Date of Patent: Dec. 20, 1994

[54] TRANSFER DEVICE FOR TRANSFERRING A SUBSTRATE

[75] Inventors: Tsutomu Hiroki; Teruo Asakawa, both of Yamanashi, Japan

[73] Assignees: Tokyo Electron Limited, Tokyo; Tokyo Electron Yamanashi Limited, Nirasaki, both of Japan

[21] Appl. No.: 942,841

[22] Filed: Sep. 10, 1992

[30] Foreign Application Priority Data

| Jul. 29, 1982 | [JP] | Japan | 4-202370 |
| Sep. 10, 1991 | [JP] | Japan | 3-230344 |
| Sep. 26, 1991 | [JP] | Japan | 3-247720 |
| Oct. 8, 1991 | [JP] | Japan | 3-290502 |
| Oct. 8, 1991 | [JP] | Japan | 3-290503 |

[51] Int. Cl.⁵ .................................. B65G 47/24
[52] U.S. Cl. .................... 414/217; 414/750; 414/774; 414/936
[58] Field of Search .......... 414/217, 744.1, 744.2, 414/750, 757, 774, 775, 936

[56] References Cited

U.S. PATENT DOCUMENTS

| 4,024,944 | 5/1977 | Adams et al. | 414/936 X |
| 4,365,400 | 12/1982 | Carlomagno | 414/750 X |
| 4,425,075 | 1/1984 | Quinn | 414/774 X |
| 4,483,434 | 11/1984 | Miwa et al. | 414/757 X |
| 4,582,191 | 4/1986 | Weigand | 414/744.2 X |
| 4,655,584 | 4/1987 | Tanaka et al. | 414/936 X |
| 4,897,015 | 1/1990 | Abbe et al. | |
| 5,052,886 | 10/1991 | Moroi | 414/936 X |
| 5,054,991 | 10/1991 | Kato | 414/936 X |
| 5,092,557 | 3/1992 | Sawatzki | |
| 5,102,280 | 4/1992 | Poduje et al. | 414/757 X |
| 5,147,168 | 9/1992 | Suwa et al. | 414/750 X |

FOREIGN PATENT DOCUMENTS

| 63-87725 | 4/1988 | Japan | 414/936 |
| 8809303 | 12/1988 | WIPO | 414/757 |

*Primary Examiner*—Michael S. Huppert
*Assistant Examiner*—James W. Keenan
*Attorney, Agent, or Firm*—Oblon, Spivak, McClelland, Maier & Neustadt

[57] ABSTRACT

A device for transferring a LCD substrate under a reduced pressure atmosphere comprises a first stage on which the LCD substrate is mounted such that the surface of the LCD substrate is substantially horizontal, a multi-joint arm mechanism for mounting the LCD substrate on a second stage of a delivery position after moving the first stage in substantially horizontal plane, a mechanism for pushing the LCD substrate on the first and second stages, and for positioning the LCD substrate at a home position.

10 Claims, 21 Drawing Sheets

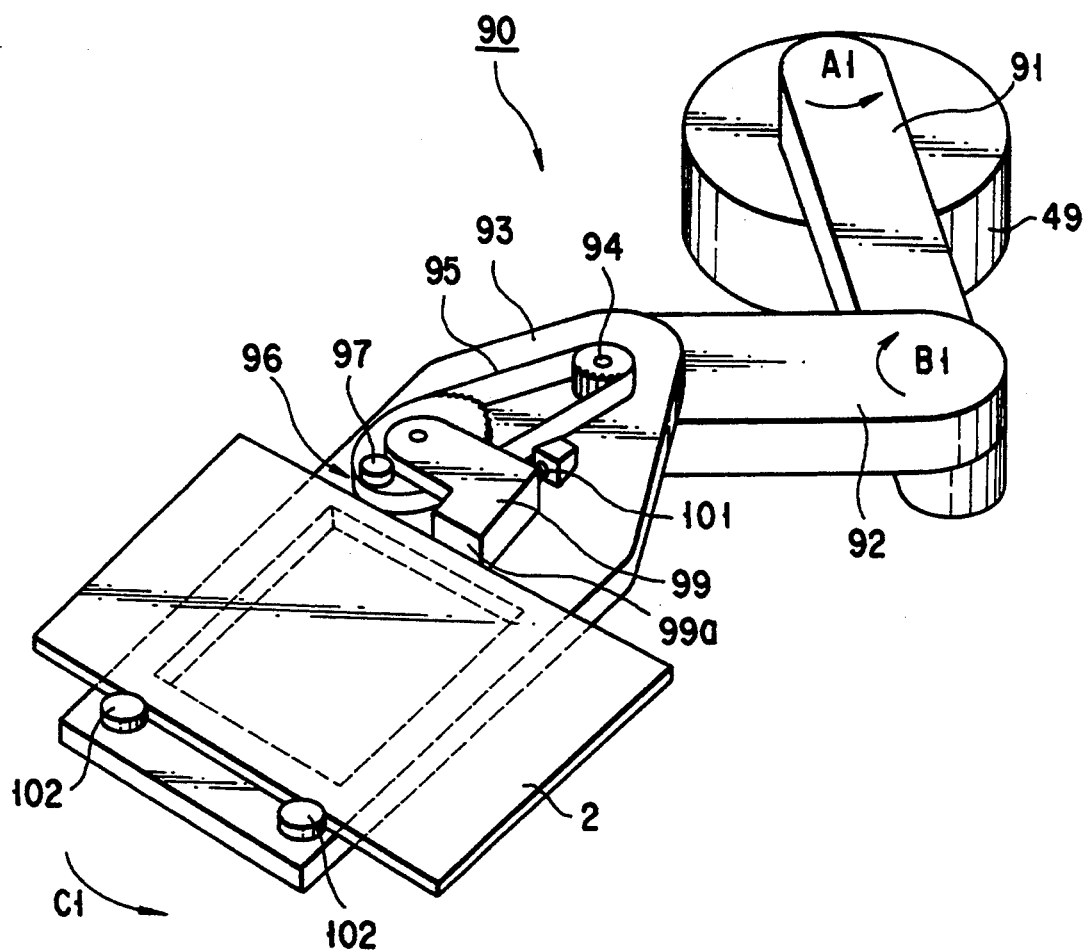
F I G. 13

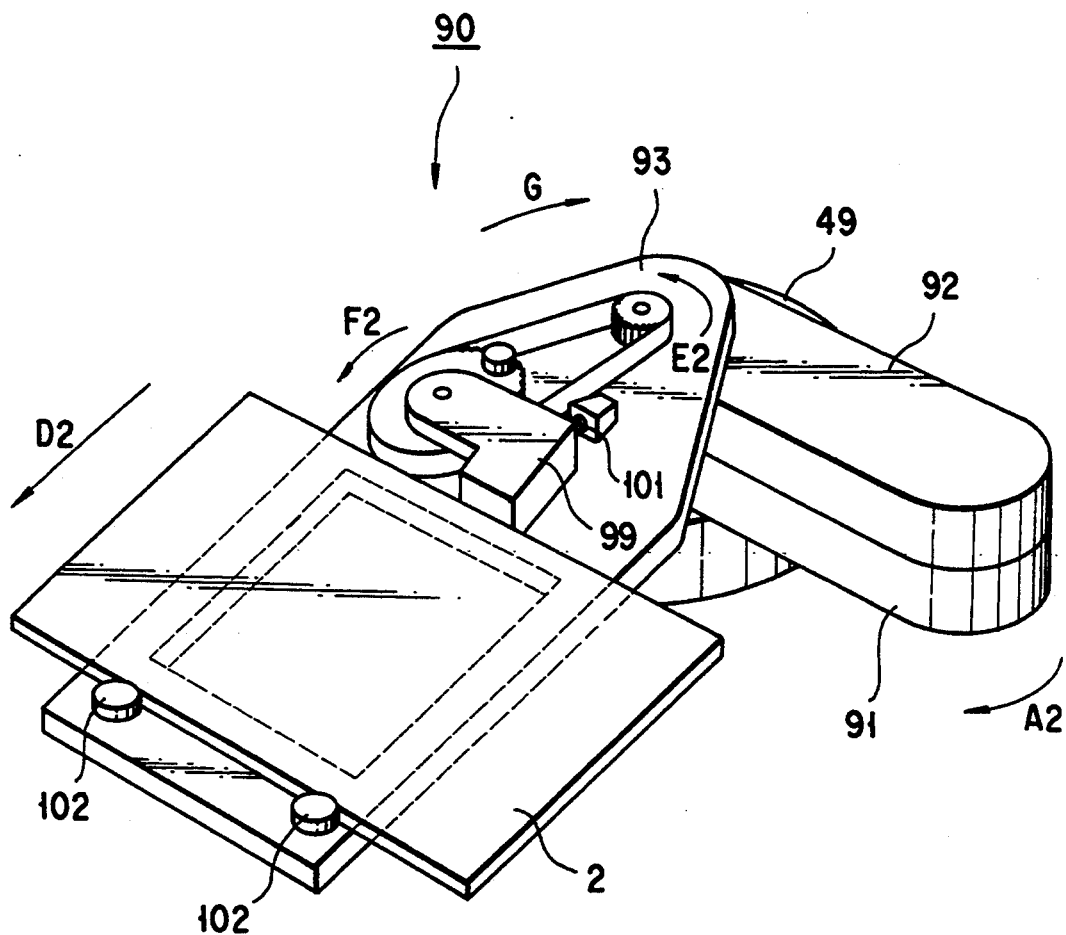
F I G. 15

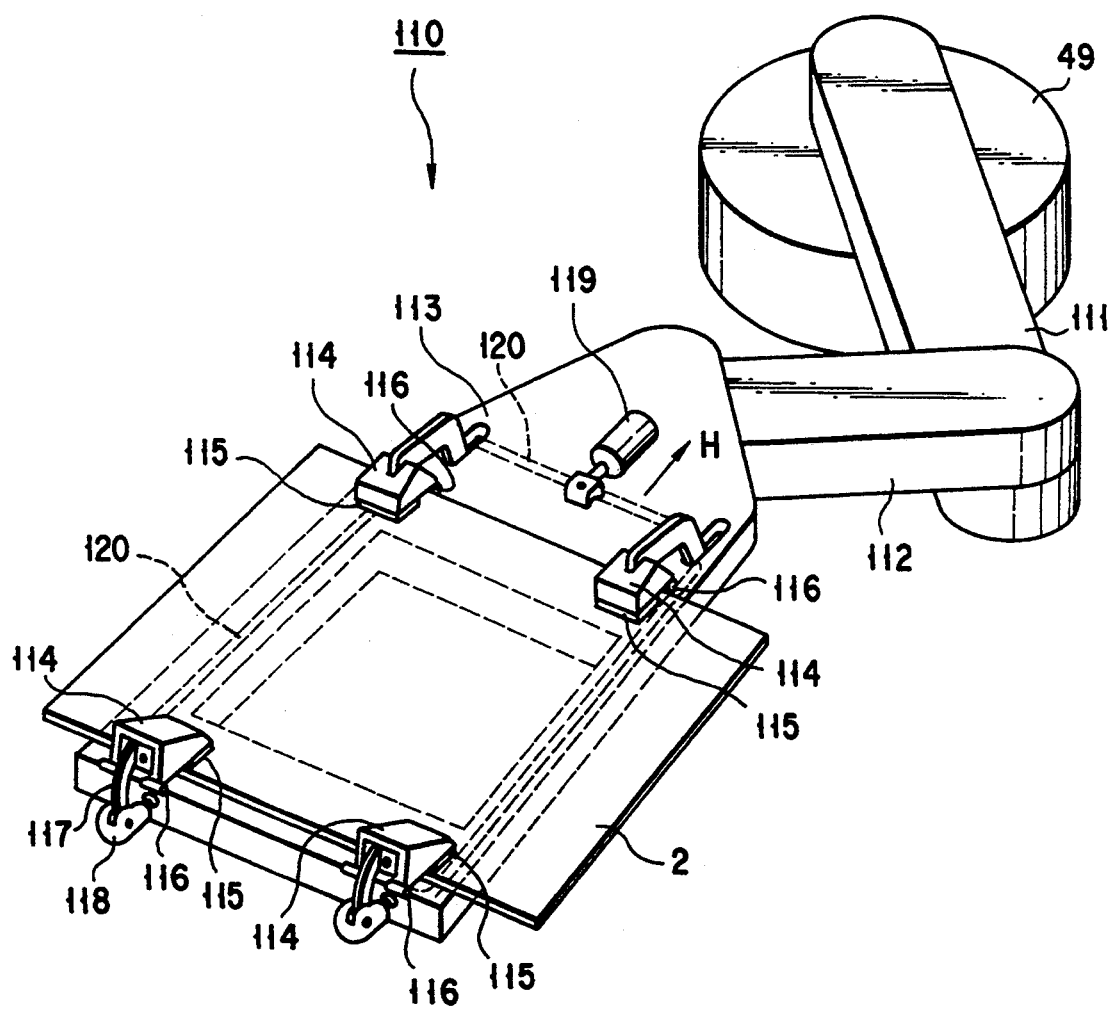
F I G. 16

FIG. 21A
FIG. 21B
FIG. 21C
FIG. 21D
FIG. 21E
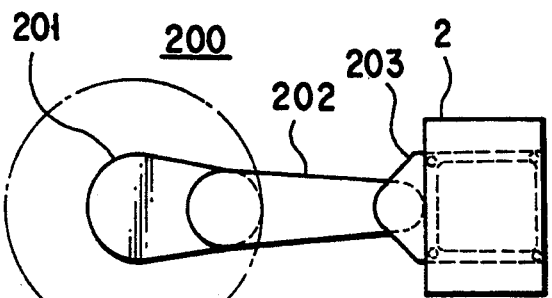
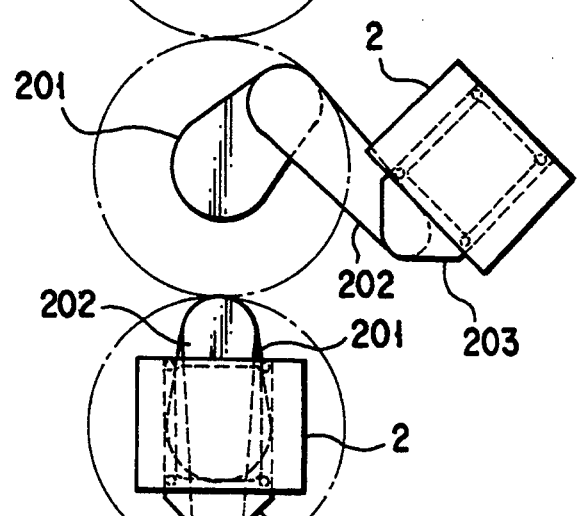
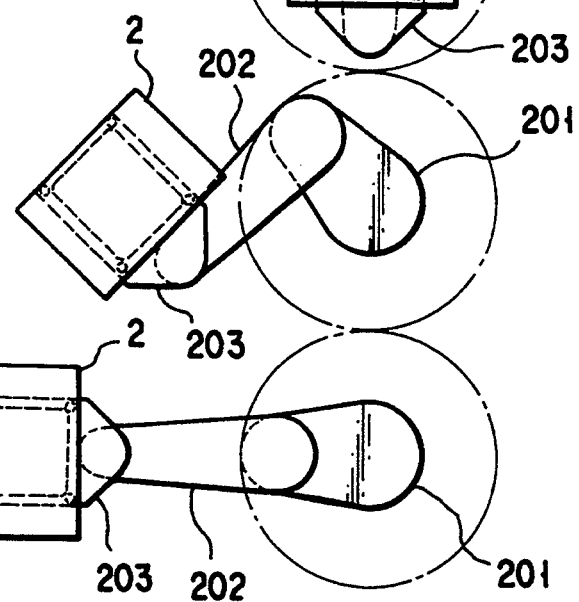
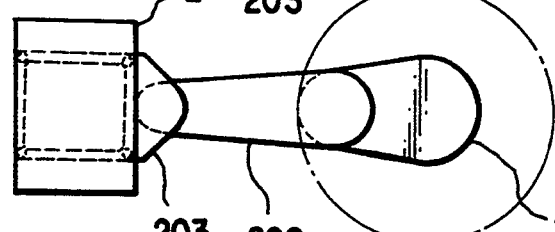

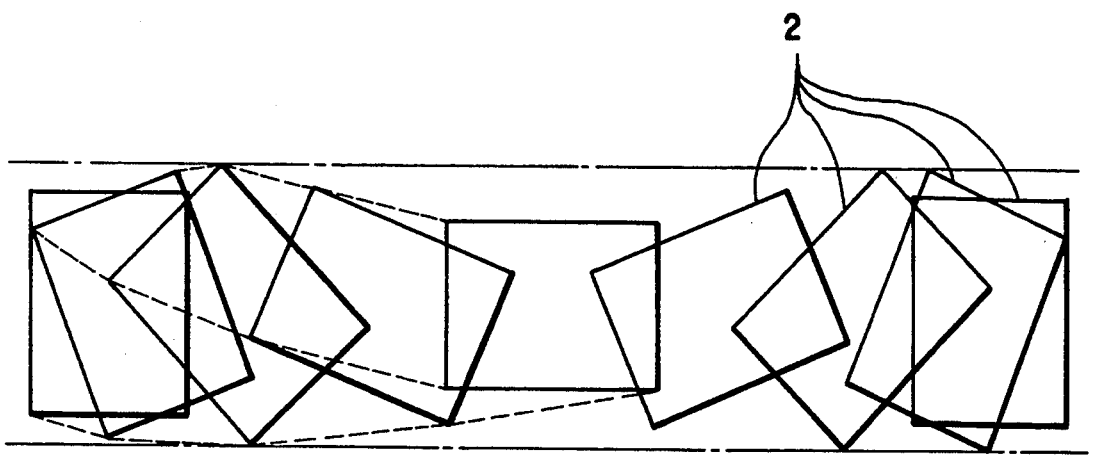
F I G. 22

TRANSFER DEVICE FOR TRANSFERRING A SUBSTRATE

BACKGROUND OF THE INVENTION

1. Field of the Invention

The present invention relates to a transfer device for transferring a substrate such as a glass substrate for a liquid crystal display, and more particularly to a transfer device for transferring a substrate to be used in a reduced-pressure chamber.

2. Description of the Related Art

There are known treatments such as etching and ashing for a glass substrate for an LCD (hereinafter called simply an LCD substrate) in a process chamber which are performed under reduced pressure. The reduced-pressure chamber system includes a load lock chamber to preliminarily generate vacuum atmosphere. The load lock chamber allows an interior chamber to avoid normal room pressures every time an LCD substrate is loaded/unloaded to the process chamber.

In such a load lock chamber, an LCD substrate transferring device is provided and the transferring device transfers the LCD substrate between the respective chambers (load lock chamber and interior chamber, for example).

FIG. 1 shows a conventional transferring device 3 to be used in transferring the LCD substrate. The transferring device 3 comprises arms 4, 5 and a stage 6. A LCD substrate 2 is mounted on the stage 6. Rubber projections 7 are formed on an upper surface 6a of the stage 6. These projections 7 are used so as to prevent the LCD substrate 2 from slipping off the stage 6 during the transferring operation.

In recent years, in accordance with increase in demand for LCDs, it has been desired to improve the LCD manufacturing device, which can manufacture a large amount of LCDs in a short period time, that is, improvement of the through put of an LCD manufacturing device.

In order to improve the through put of an LCD manufacturing device, not only treating time of the treating device to be used in each treatment process but also time for transferring the LCD substrate 2 by use of these treatment devices is required.

However, according to the conventional transferring device 3, the LCD substrate 2 is moved on the stage 6, and shifted from the position where the substrate 2 should be placed as the transferring speed is increased. In other words, if acceleration or deceleration is increased, an inertia force to be applied to the LCD substrate 2 is increased, so that the LCD substrate 2 is shifted from the home position (or reference position) on the stage 6. The term "home position" used in the above means a predetermined reference position, which is determined in every treatment section in order to treat the LCD substrate 2 in a post-process, for example, center position of each treatment section.

If the actual position of the LCD substrate 2 is shifted from the home position, the treatment in the post-process cannot be speedily and correctly carried out. For example, if the LCD substrate 2 is not placed at the predetermined position in the process chamber, a desirable treatment cannot carried out. Moreover, if the LCD substrate 2 collides with an inlet/outlet gate of the chamber the LCD substrate 2 may be broken.

Furthermore, the LCD substrate transferring device must be contained in a narrow space of the load lock chamber. A conventional transferring device, as disclosed in Published Unexamined Japanese Patent Application No. 1-198465, comprises at least a driving motor for expanding and retracting a link arm and a driving motor for rotating the link arm.

However, in such a transferring device, there are needed two or more driving motors, a microcomputer for controlling these motors and a sensor, and the device is enlarged and complicated.

In particular, in the transferring device provided in the load lock chamber, a magnetic sealing mechanism must be provided in the driving shafts of these driving motors. However, the cost of such a magnetic sealing mechanism is high, and if the sealing positions are increased, the cost of the device is increased.

Moreover, since the number of structural parts is large in the conventional transferring device, the trouble rate of the device is high, and reliability is low. In a case where the load chamber is adjacent to the etching chamber, dust or particles generated by the rotation shaft of the multi-shaft driving are adhered to the LCD substrate, and the so-call contamination of products is generated.

Furthermore, in the substrate transferring device provided in the load lock chamber for realizing high vacuum, the width of the space, which is necessary for the rotations of the link arm and the substrate, must be narrowed as much as possible such that the transferring operation is realized in the narrow space and the load lock chamber is miniaturized.

SUMMARY OF THE INVENTION

An object of the present invention is to provide a device for transferring a substrate in which the substrate can be surely placed at a predetermined position in a reduced-pressure chamber and damage of the substrate can be prevented during the transferring operation.

Further, another object of the present invention is to provide a device for transferring a substrate in which the structure is simple, the size of the device is small, reduction of manufacturing cost of the device and improvement of reliability can be achieved, a transferring operation can be realized in a narrow space, and the capacity of a load lock chamber can be small.

According to an aspect of the present invention, a device for transferring a substrate under a reduced pressure atmosphere comprises a first stage on which a substrate is mounted such that the surface of the substrate is substantially horizontal, a second stage arranged at a delivery position for delivering the substrate, means for mounting the substrate on the second stage after transferring the substrate to the delivery position together with the first stage, and rectifying means for rectifying a difference of the position where the substrate 2 should be placed for a post-treatment after pushing the substrate to the first stage or the second stage.

According to another aspect of the present invention, a device for transferring a substrate comprises a stationary base, rotation means, a first link connected to a driving shaft of the rotation means and rotated in substantially a horizontal plane, a first pulley fixed to the stationary base, a second pulley jointed to the first pulley by a belt, a second link connected to the second pulley and rotated in a substantially horizontal plane together with the second pulley, a third pulley connected to the first link and provided coaxially with the second pulley, a fourth pulley jointed to the third pulley by a belt, and a stage having a substrate to be mounted thereon, connected to the fourth pulley, and rotated in substantially the horizontal plane together with the fourth pulley.

According to another aspect of the present invention, a reduced-pressure chamber system comprises a process chamber for providing a predetermined treatment to a substrate under reduced pressure, a load lock chamber provided to be adjacent to the process chamber and exhausting the interior of the chamber, and a substrate transferring mechanism, provided in the load chamber, for transferring the substrate in/out of the process chamber, wherein the substrate transferring mechanism comprises a first stage on which a substrate is mounted such that the surface of the substrate is substantially horizontal, means for mounting the substrate on a second stage of a delivery position after transferring the substrate to the delivery position together with the first stage, and rectifying means for rectifying a difference of the position where the substrate should be placed for an after-treatment after pushing the substrate to the first stage or the second stage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a perspective view showing the substrate transferring device having the positional difference rectifying assembly of a fourth embodiment;

FIG. 15 is a perspective view showing the substrate transferring device having the positional difference rectifying assembly of the fourth embodiment in a state that the arm is retracted and released from the push members;

FIG. 16 is a perspective view showing the substrate transferring device having the positional difference rectifying assembly of a fifth embodiment;

FIGS. 21A to 21E are plan views showing each posture of the substrate transferring device in order to explain the operation of the substrate transferring device of the sixth embodiment of the present invention; and FIG. 22 is a plan model view schematically showing the change of the posture of the substrate when being transferred.

DETAILED DESCRIPTION OF THE PREFERRED EMBODIMENTS

The following explains various embodiments in which the device for transferring the substrate of the present invention is applied to a reduced-pressure processing system of a multi-chamber type having a plurality of process chambers for treating the LCD substrate, with reference to the drawings.

Figure 1:
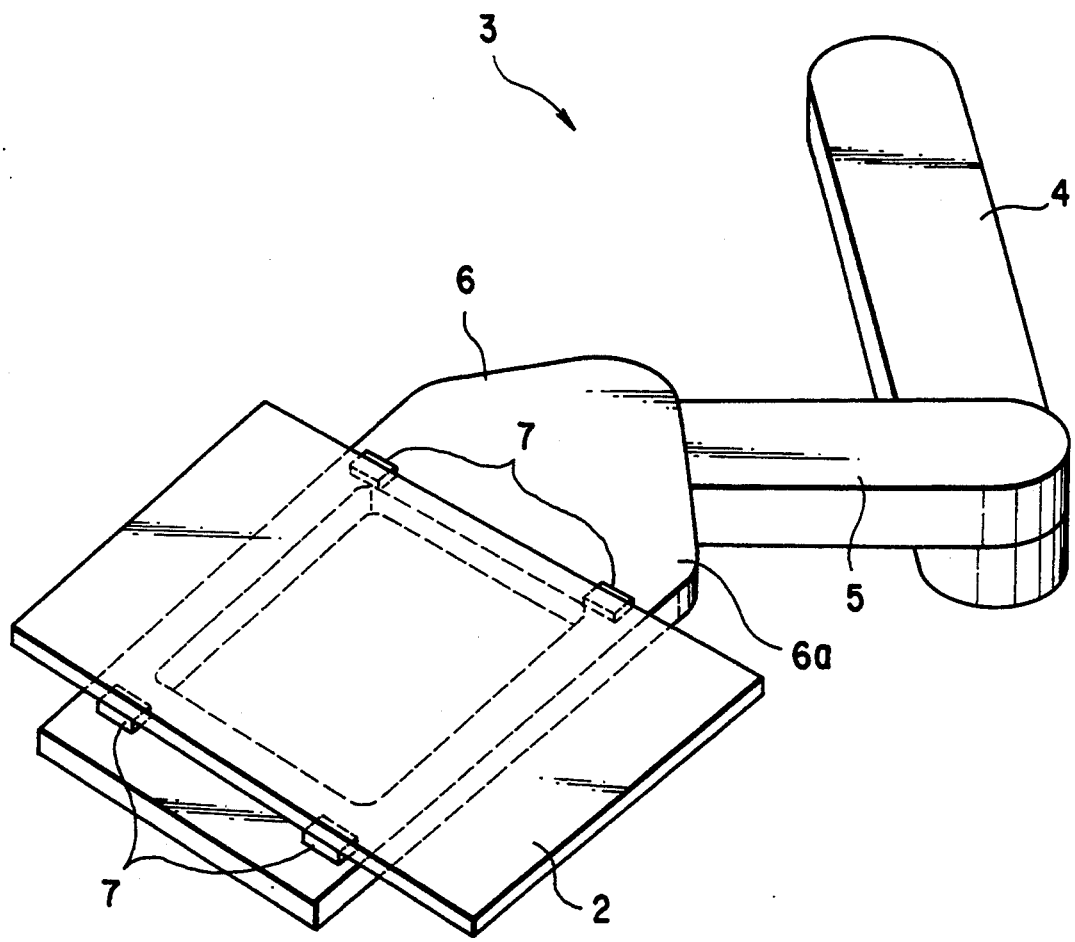
FIG. 1 is a perspective view showing a conventional transfer device for transferring a substrate.
Figure 2:
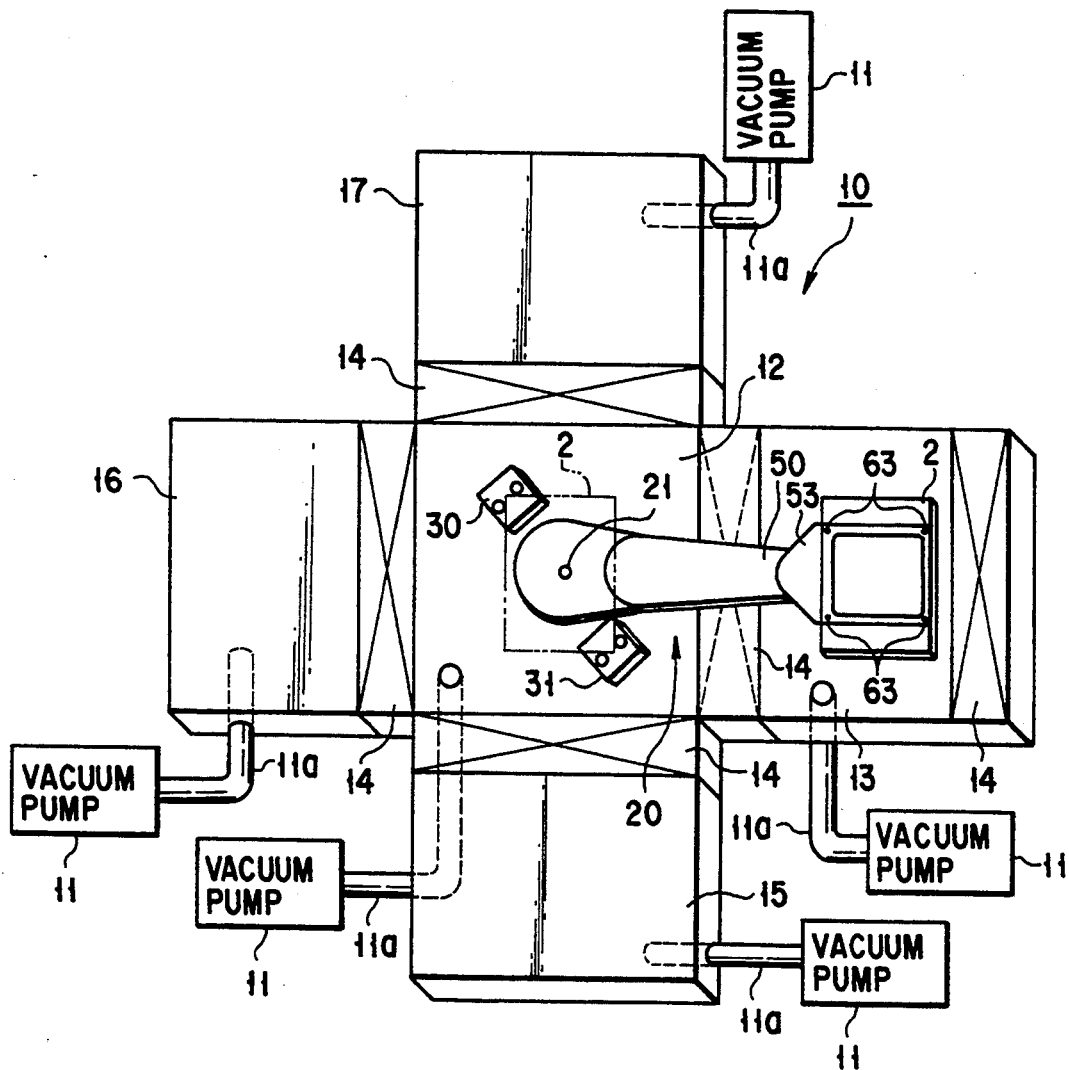
FIG. 2 is an internal plan view showing an outline of a reduced-pressure chamber provided in the substrate transferring device having a positional difference rectifying assembly according to a first embodiment of the present invention.

As shown in FIG. 2, a transferring device 20 of the first embodiment is provided in a load lock chamber 12 of the reduced-pressure processing system. The four edges of the load lock chamber 12 are enclosed with an auto-loader chamber 13, and three process chamber 15. 16, and 17. A gate valve 14 is provided between the load lock chamber 12 and the respective chambers 13, 15, 16, and 17, respectively. If each gate valve 14 is closed, the interior of the load lock chamber 12 is maintained airtight. A pipe 11a of a vacuum pump 11 is passed through each wall of the respective chambers 12, 13, 15, 16, and 17, so that the interior of each chamber is independently exhausted.

In the auto-loader chamber 13, an LCD station (not shown) is provided. The LCD station comprises compartments of a plurality of stages, and an LCD glass substrate 2 (hereinafter called LCD substrate) is mounted on the compartment of each stage one by one. The LCD station is moved up and down by a controller (not shown) backed up by a computer system.

The gate valve 14 is also provided in the other surface of the auto-loader chamber 13 (the surface opposite to the surface facing to the load lock chamber 12). The LCD substrate 2 is transferred to the LCD station of the chamber 13 by an external handling device (not shown) via the gate valve 14 provided in the other surface.

Each interior of the process chambers 15, 16, and 17 is communicated with a process gas supply source (not shown) through a pipe (not shown). In other words, process gas is supplied to each interior of the chambers 15, 16, 17 from each gas supply source, and an etching process and an ashing process are carried out in the LCD substrate 2.

The LCD transferring device 20 of the first embodiment is rotated on a shaft 21 serving as a center. The shaft 21 is positioned at a central home position of the load lock chamber 12. An arm 50 of the transferring device 20 is three-joint link structure. A holder 53 is attached to the top end of the three-joint link arm 50. Four pins 63 are projected onto the upper surface of the holder 53, and the LCD substrate 2 is held by these pins 63. These pins 63 are formed of soft material having a high coefficient of friction such as a Byton-made O-shaped ring. The use of these pins 63 is to prevent the LCD substrate 2 from being slipped on the holder 53.

The stroke length of the three-joint link arm 50 ranges from the home position of the chamber 12 to the LCD station of the chamber 13. If the three-point link arm 50 is rotated, the LCD substrate 2 is positioned at the home position of the chamber 12. There are provided positional difference rectifying assembly 30 and 31, which apply force to the LCD substrate 2 positioned at the home position in a diagonal direction of the pattern surface so as to prevent the LCD substrate 2 from being shifted from the home position.

The first positional difference rectifying assembly 30 and the second positional difference rectifying assembly 31 are faced to each other, and have substantially the same structure. The first and second positional difference rectifying assembly 30, 31 are controlled such that their operations are synchronized with each other by a controller backed up by a common computer system.

The first and second positional difference rectifying assembly 30, 31 will be explained with reference to FIG. 3, FIGS. 4A to 4C and FIG. 5. In this case, only the first positional difference rectifying assembly 30 is illustrated and explained and the second positional difference rectifying assembly 31 is omitted.

Figure 3:
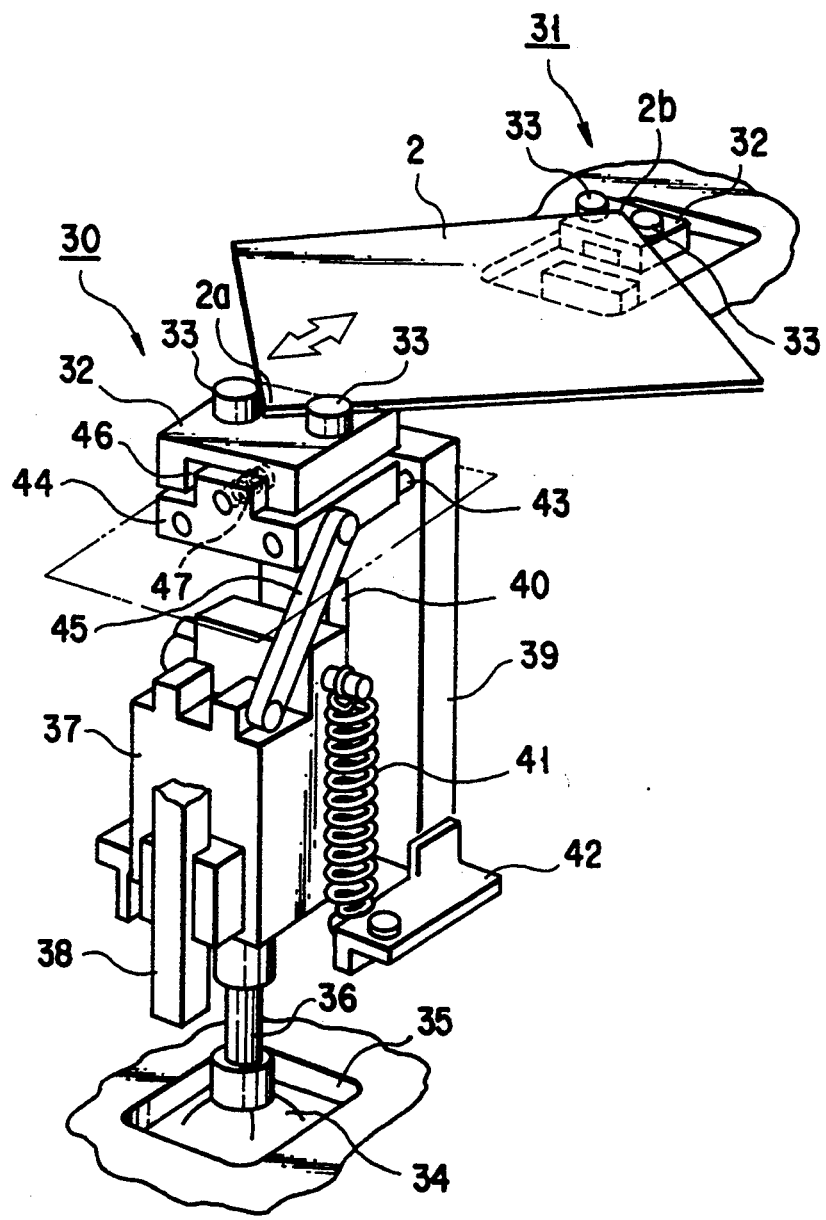
FIGS. 3 is a perspective view showing the positional difference rectifying assembly of the first embodiment.

As shown in FIG. 3, a pair of rollers 33 are attached to the upper surface of a stage 32 of the first assembly 30. If the LCD substrate 2 is positioned at the home position, a corner 2a of the LCD substrate 2 is positioned between these rollers 33. The diameter of each roller is 10 mm, and the distance between the shaft centers of the rollers is 46 mm. These rollers 33 directly come in contact with the LCD substrate 2. Due to this, these rollers 33 are preferably formed of material, which is not easily deformed, such as polytetrafluoroethylene. The length of a long side of the LCD substrate 2 is 400 mm, and that of a short side is 300 mm, and the thickness of the LCD substrate 2 is 1.1 mm.

The stage 32 is held to be moved up and down by a moving mechanism having an air cylinder 34. More specifically, an upper end of a cylinder shaft 36 is connected to a moving base 37, and one side of the moving base 37 is connected to an intermediate base 39, and the upper end of the intermediate base 39 is connected to a guide shaft 43. Moreover, a positioning base 44 is slidably connected to the guide shaft 43, and the stage 33 is provided on the positioning base 44.

The positioning base 44 is connected to the moving base 37 through a lever link 45. The other end of the moving base 37 is slidably connected to a linear guide 38. A tension spring 41 is attached between the moving base 37 and the intermediate base 39. A stopper 42 is formed in the lower portion of the intermediate base 39. The stopper 42 is hooked to the extending portion of a fixing frame 35, and used to stop the operation of elevating the intermediate base 39. The linear guides 38 and 48 are fixed to the fixing frame 35, respectively.

Figure 5:
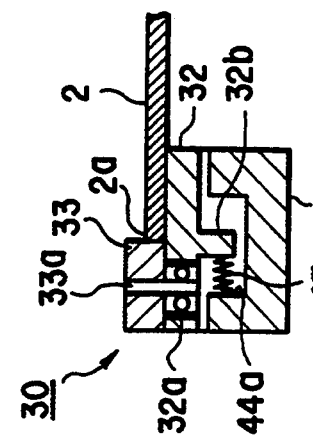
FIG. 5 is a partial cutaway longitudinal cross sectional view of a movable roller portion of the positional difference rectifying assembly.

As shown in FIG. 5, a projection 32b is formed in the lower portion of the stage 32. The projection 32b is positioned at an intermediate portion of the upper concave portion of the positioning base 44. A compression spring is provided between the projection 32b and a projection 44a of the upper portion of the positioning base. A shaft 33a of each roller 33 is rotatably supported by a bearing 32a.

Figures 4A, 4B, 4C:
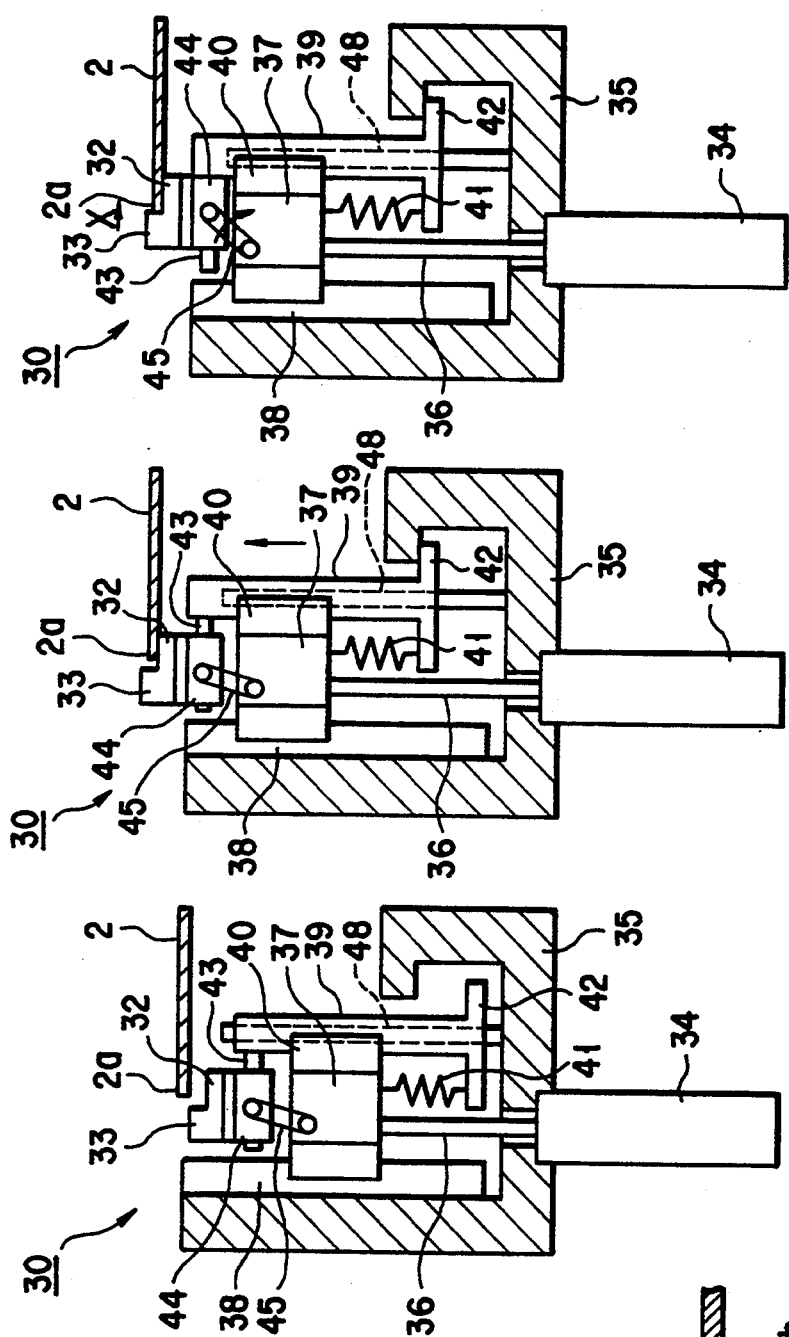
FIGS. 4A to 4C are partial cutaway longitudinal cross sectional views of the positional difference rectifying assembly so as to explain the operation of the positional difference rectifying assembly.

The following will explain the situation in which the positional difference of the LCD substrate 2 from the load lock chamber 12 is rectified by the first and second positional difference rectifying assembly 30 and 31 with reference to FIGS. 4A to 4C.

The gate valve 14 is opened, and the LCD substrate 2 is transferred to the load lock chamber 12 from the auto-loader chamber 13 by the transferring device 20. Then, the gate valve 14 is closed, and the interior of the load lock chamber 12 is exhausted. During the exhausting operation, the positional difference of the LCD substrate 2 from the home position is rectified by the first and second positional difference rectifying assembly 30 and 31.

As shown in FIG. 4A, when the LCD substrate 2 is transferred to the home position from the transferring device 20, the stage 32 of the first assembly 30 is positioned just below the corner 2a of the LCD substrate 2 (At this time, the stage 32 of the second assembly 31 is positioned just below a diagonal corner).

Then, the cylinder shaft 36 is projected, and the stage 32 is moved up together with the intermediate base 39. The corner 2a of the LCD substrate 2 is pushed up by the stage 32, and the LCD substrate 2 is lifted from the holder 53 of the transferring device 20.

As shown in FIG. 4B, the stopper 42 collides with the frame 35, and the rise of the stage 32 and the intermediate base 39 are stopped. However, the moving base 37 is continuously moved up. Due to this, as shown in FIG. 4C, an lever 45 is oscillated clockwise in the drawing, and the positioning base 44 is moved in an X direction of the drawing. The stage 32 is moved in the X direction together with the positioning base 44.

As shown in FIG. 5, the each surface of the rollers: 33 comes in contact with the end surface of the LCD substrate 2, which is close to the corner 2a. At this time, since force in the X direction is transmitted to the stage 32 through a compression spring 47, soft pushing force (not excessive force) is applied to the end surface of the LCD substrate 2 from the roller 33. As a result, the LCD substrate 2 can be firmly held at the home position without damaging the end surface of the LCD substrate 2.

Figure 6:
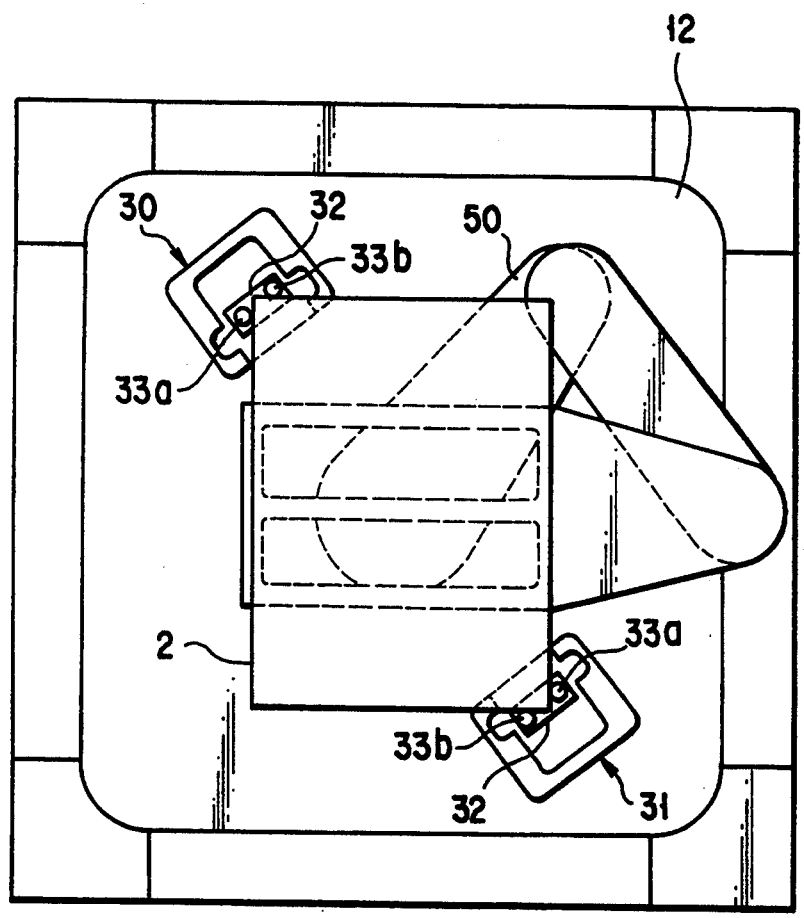
FIG. 6 is a plan view showing the positional difference rectifying assembly wherein a roller having a large diameter and a roller having a small diameter are combined.

The following will explain the situation in which the LCD substrate whose size is different from the above-explained standard size substrate 2 is used with reference to FIG. 6.

In the case that the LCD substrate whose size is smaller than the above-used standard size substrate 2 is used, the corner portion of the LCD substrate is far away from the rollers 33, and this makes it difficult to rectify the positional difference of the LCD substrate 2 from the home position.

In the above-explained first and second positional difference rectifying assembly 30 and 31, the pair of rollers 33 are detachably attached to the stage 32.

As shown in FIG. 6, one of rollers 33 is replaced with a roller 33b having a diameter smaller than the standard size. Thereby, the mutual distance between the rollers 33a and 33b is expanded, so that the corner portions 2a and 2b of the LCD substrate 2 can be easily inserted into the rollers 33a, 33b.

The following will be explained the case that the long side of the LCD substrate 2 is exchanged for the short side and the LCD substrate 2 is transferred to the load lock chamber 12 with reference to FIG. 7 and FIGS. 8A to 8D.

Figure 7:
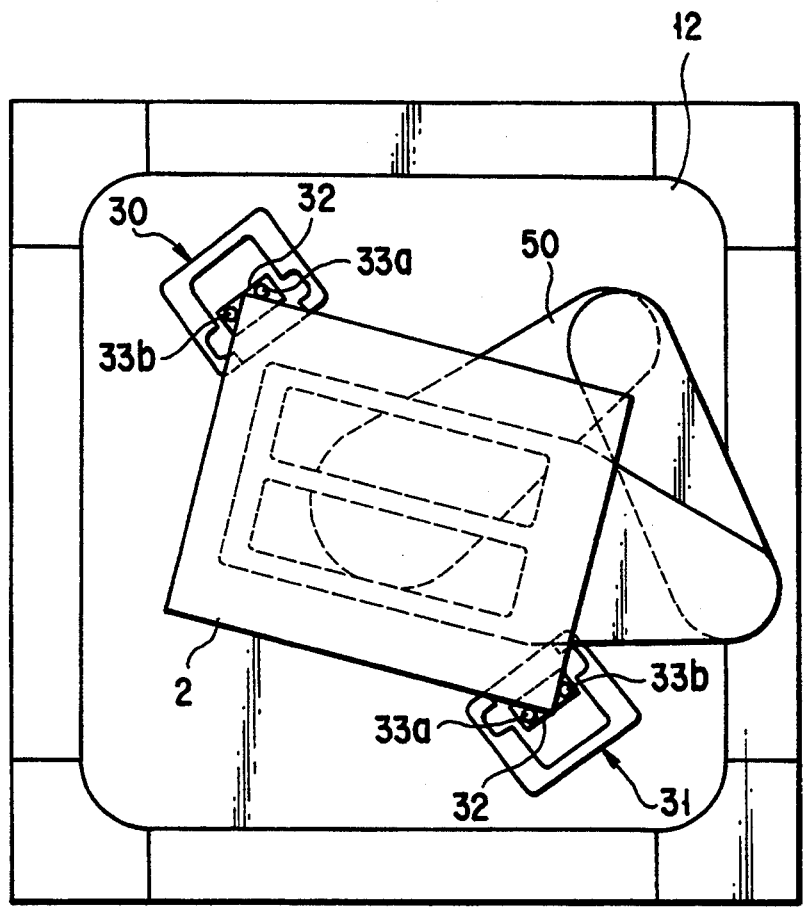
FIG. 7 is a plan view showing the positional difference rectifying assembly wherein a roller having a large diameter and a roller having a small diameter are combined.

As shown in FIG. 7, one of rollers 33 is replaced with a roller 33b having a diameter smaller than the standard size, and the mutual distance between the rollers 33a and 33b is expanded.

Figure 8A:
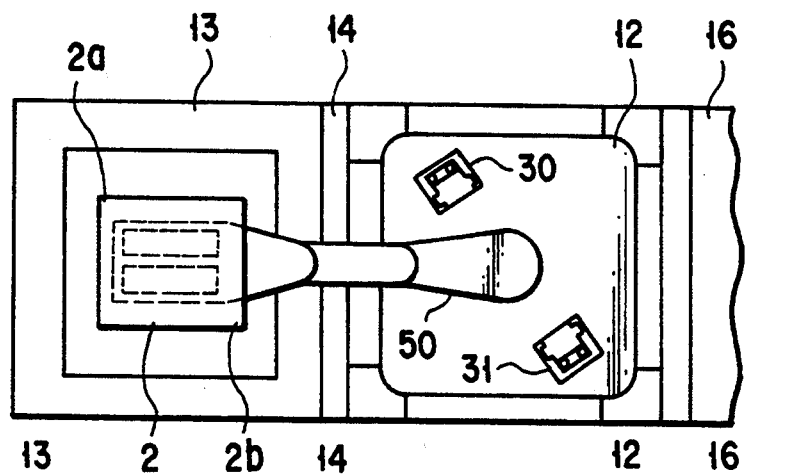
FIGS. 8A to 8D are plan views showing the substrate transferring device in the reduced-pressure chamber to explain the operation operation of the substrate transferring device of the first embodiment.
Figure 8B:
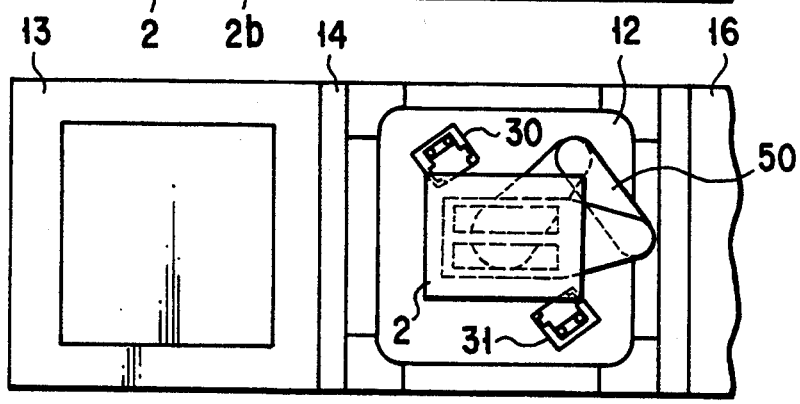
Figure 8C:
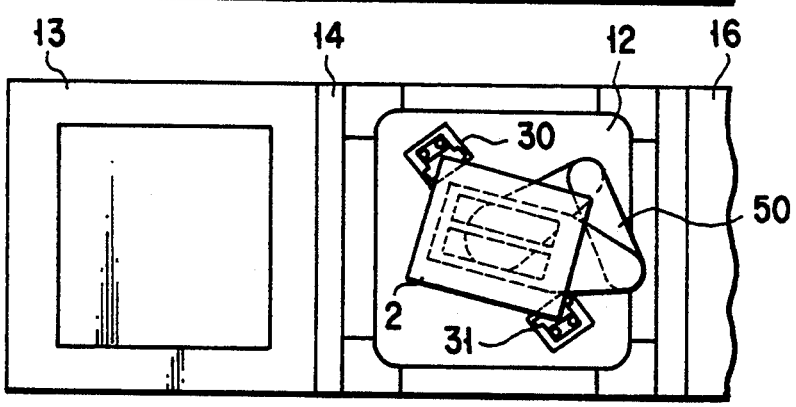

As shown in FIG. 8A, the LCD substrate 2 is mounted in the chamber 13 such that the long side of the LCD substrate 2 is directed to the transferring direction. As shown in FIG. 8B, the arm of the transferring device 50 is retracted, and the LCD substrate 2 is positioned between the first and second positional difference rectifying assembly 30 and 31. Then, the LCD substrate 2 is rotated by a predetermined angle and the corners 2a and 2b of the LCD substrate 2 are directed to the the first and second positional difference rectifying assembly 30 and 31 as shown in FIG. 8C.

Figure 8D:
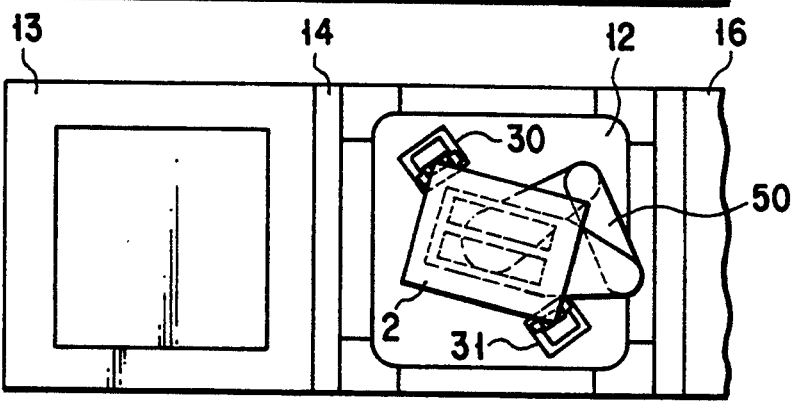

As shown in FIG. 8D, the rollers 33a and 33b of the first positional difference rectifying assembly 30 are pressed to contact the corner 2a of the LCD substrate 2, and the rollers 33a and 33b of the second positional difference rectifying assembly 31 are pressed to contact the corner 2b of the LCD substrate 2. Thereby, the positional difference of the LCD substrate 2 from the home position can be rectified.

According to the above embodiment, the positional difference of the LCD substrate 2 from the home position can be easily rectified by changing the diameter of the paired rollers 33, and the control program for the transferring device 20. As mentioned above, the conventional problems can be solved by the simple treatment without largely changing the hardware in the load lock chamber. Therefore, there is an advantage in that flexibility of design can be improved.

The above embodiment explained the case using the multi-chamber typed processing system comprising three process chambers 15, 16, and 17. Similarly, the present invention can be applied to the case using a single chamber typed processing system comprising one process chamber.

Moreover, the above embodiment explained the case using the LCD substrate as an object to be transferred. However, the present invention is not limited to such an LCD substrate. Other substrate such as a semiconductor wafer may be used as an object to be transferred.

A second embodiment of the present invention will be explained with reference to FIGS. 9 to 11.

Figure 9:
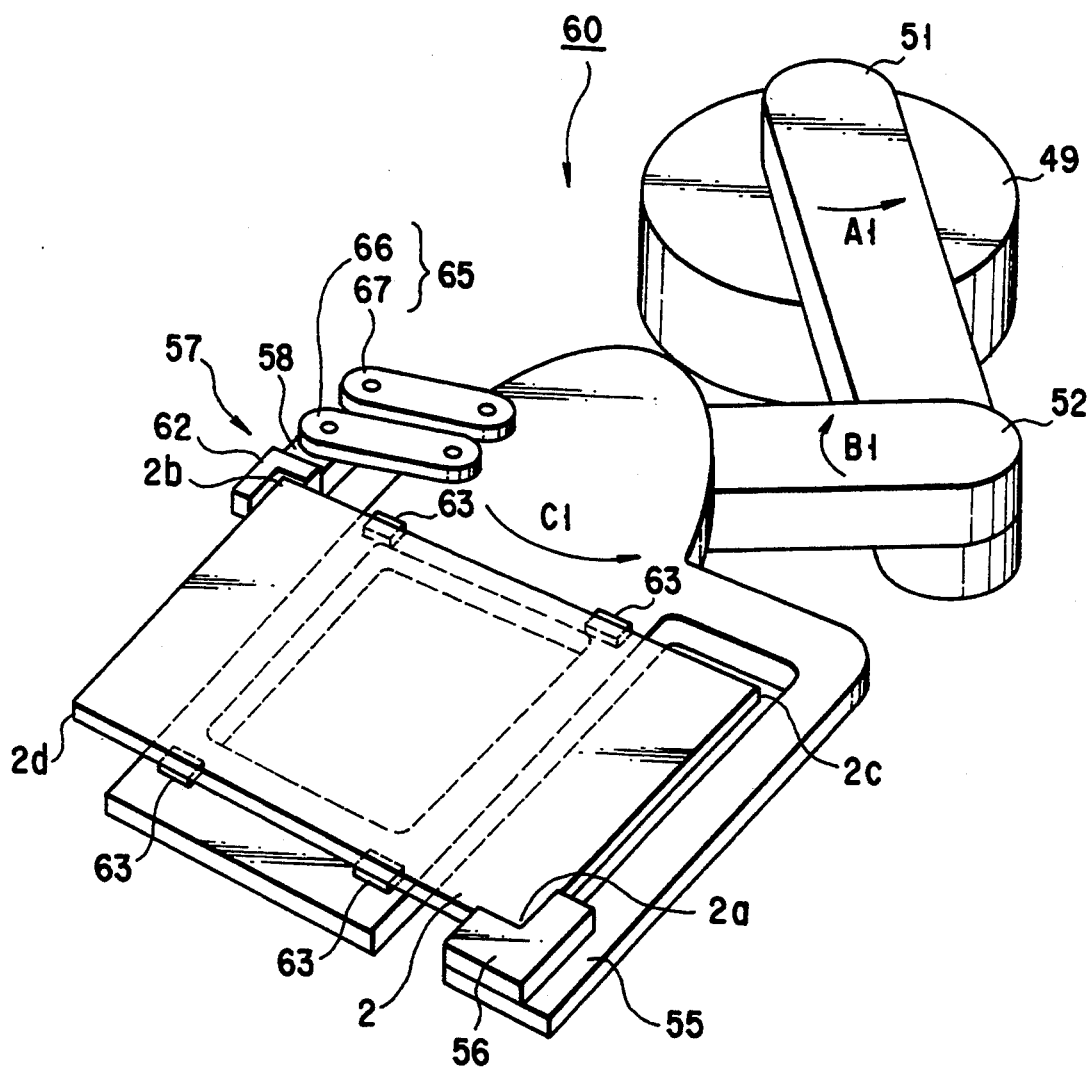
FIG. 9 is a perspective view showing the substrate transferring device having the positional difference rectifying assembly of a second embodiment.

As shown in FIG. 9, a transferring device 60 comprises a three-joint link arm formed of a first arm 51, a second arm 52, and a stage 53. The first arm 51 is provided on a base 49. The base 49 is rotated by a first driving motor (not shown).

The respective members 51, 52, and 53 are connected to each other by rotation shafts (not shown). These rotation shafts are moved at the same time by a pulley (not shown) and a belt (not shown) which are provided in the first and second arms 51 and 52. The first arm 51 is connected to a second driving motor (not shown), and can be rotated in accordance with the rotation drive of the driving motor.

The first and second arms 51 and 52 are always rotated in the opposite direction (direction $A_1$ and direction $B_1$).

A first holding assembly 55 and a second holding assembly 57 are attached to the stage 53 to be faced to each other. The first holding assembly 55 has a stationary member 56 to be in contact with the end surface of the LCD corner 2a. The second holding assembly 57 has a movable member 62 to be in contact with the end surface of the LCD corner 2b. These members 56 and 62 are L-shaped, and formed of elastic soft material such as silicon rubber.

The stationary member 56 of the first holding assembly 55 is fixed to the stage 53. The movable member 62 of the second holding assembly 57 is attached to an arm 58, which is supported by a parallel link 65.

One end of each of two parallel link members 66 and 67 of the parallel link 65 is provided the stage 53. The parallel link 65 is driven by a third driving motor (not shown).

On the upper surface of the stage 53, there are provided four supporting members 63 for supporting the LCD substrate 2. These supporting members 63 are formed of soft material such as silicon rubber.

The following will be explained the case that the LCD substrate 2 is transferred by use of the transferring device 60 with reference to FIGS. 9 to 11.

Figure 10:
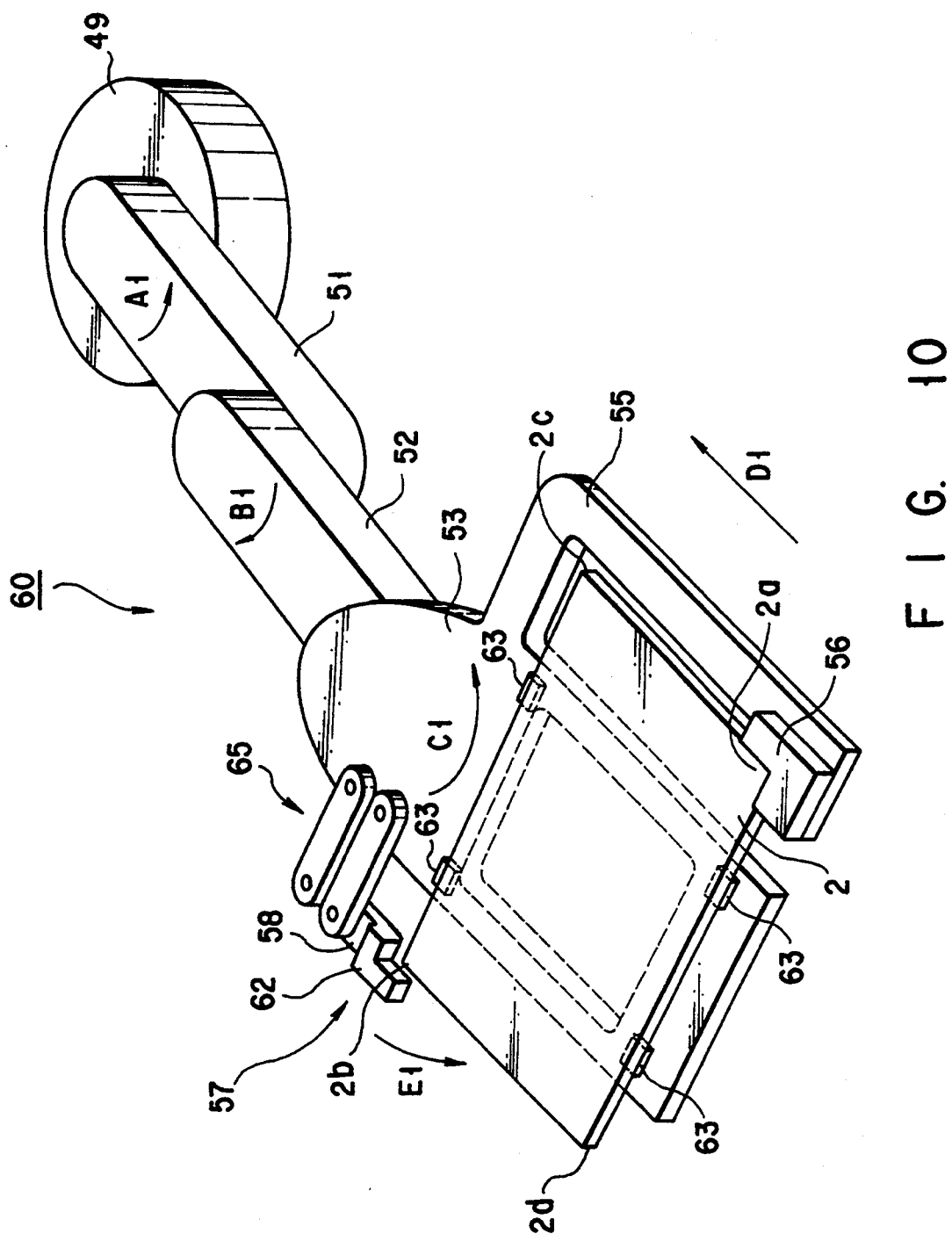
FIG. 10 is a perspective view showing the substrate transferring device having the positional difference rectifying assembly of the second embodiment in a state that the arm is expanded and released from push members.

As shown in FIG. 10, the arms 51 and 52 are extended to the station in the auto-loader 13, and the LCD substrate 2 in the station is moved to be mounted on the stage 53. Then, the parallel link 65 is moved in a direction of $E_1$ in the drawing, and the movable member 62 is brought in contact with the end surface of the LCD substrate 2. Thereby, pushing force is applied to the LCD substrate 2 from the corners 2a and 2b to the center along the diagonal line of the LCD substrate 2. As a result, the positional difference of the LCD substrate 2 from the home position is rectified, and the LCD substrate 2 can be firmly held.

If the first arm 51 is rotated in the direction $A_1$ in the drawing, the second arm 52 is rotated in the direction $B_1$ in the drawing, the stage 53 is rotated in the direction $C_1$ in the drawing. As a result, the stage 53 is moved back in the direction $D_1$ in the drawing.

The LCD substrate 2 tends to be moved in a direction opposite to the transferring direction (direction $D_1$ in the drawing) at the time of acceleration (initial period of time of movement). On the other hand, the LCD substrate 2 tends to be moved in the transferring direction at the time of deceleration (final period of time of movement). However, since the LCD substrate 2 is firmly held by the first and second holding assembly 56 and 57, the LCD substrate 2 is not slipped from the stage 53.

Figure 11:
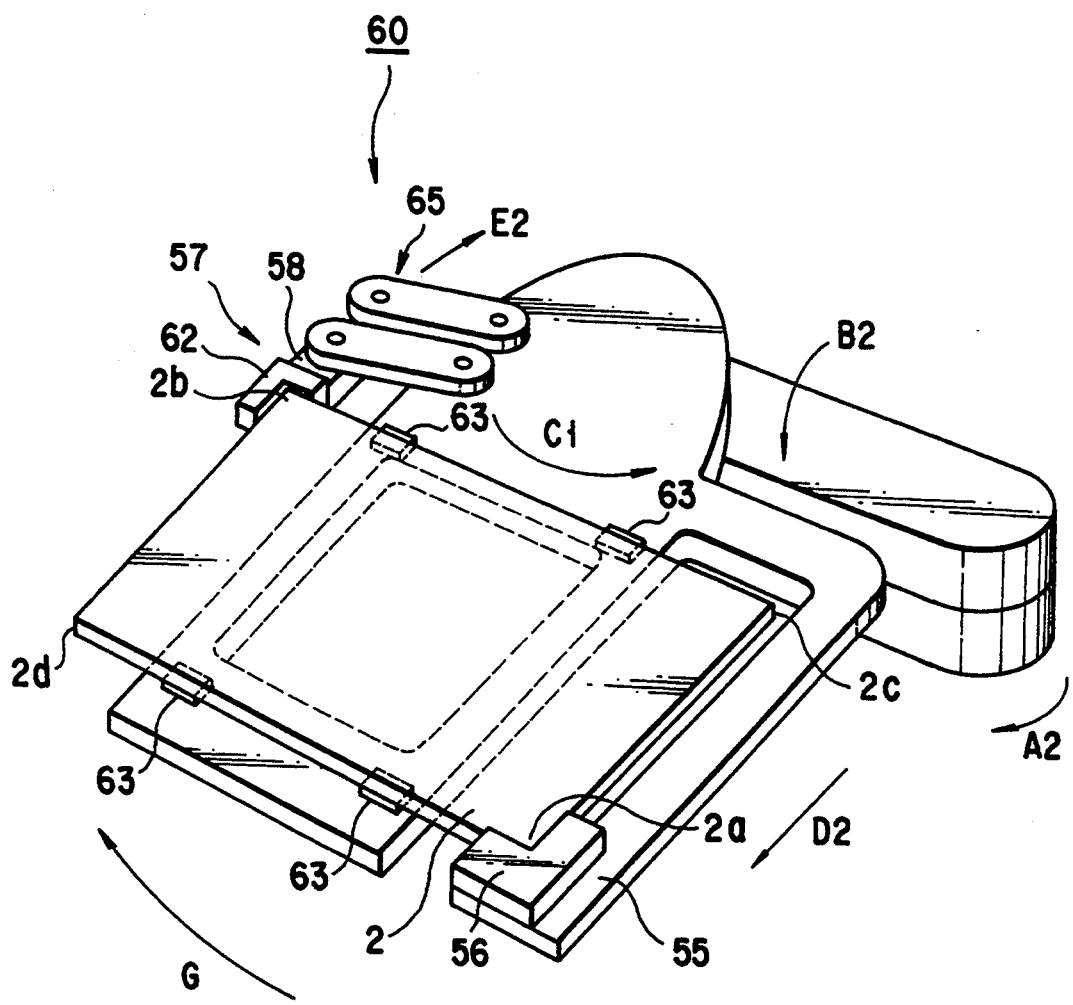
FIG. 11 is a perspective view showing the substrate transferring device having the positional difference rectifying assembly of the second embodiment in a state that the arm is retracted and pushed by the push members.

As mentioned above, if the stage is moved in the direction D1 in FIG. 2, the transferring device 60 and the LCD substrate 2 are finally positioned as shown in FIG. 11.

Moreover, the second driving motor (not shown) is driven and the base 49 is rotated in a direction G in the drawing. At this time, the LCD substrate 2 tends to be shifted in the direction opposite to the transferring direction (direction G in the drawing) at the time of acceleration (initial period of time of rotation). On the other hand, the LCD substrate 2 tends to be shifted in the transferring direction at the time of deceleration (final period of time of rotation). However, since the LCD substrate 2 is firmly held by the first and second holding assembly 55 and 57, the LCD substrate 2 is not slipped from the stage 53.

The rotation of the base 49 is stopped, and the first arm 51 is rotated in the direction $A_2$ in the drawing. Thereby, the stage 53 is moved in the direction $D_2$ in the drawing.

Also, in this movement, the LCD substrate 2 tends to be shifted in the direction opposite to the transferring direction (direction D2 in the drawing) at the time of acceleration (initial period of time of movement). On the other hand, the LCD substrate 2 tends to be shifted in the transferring direction at the time of deceleration (final period of time of movement). However, since the LCD substrate 2 is firmly held by the first and second holding assembly 55 and 57, the LCD substrate 2 is not slipped on the stage 53. Finally, the link arm 58 is moved in a direction E 2 in the drawing, and the holding of the LCD substrate 2 is released.

According to the above-explained transferring device 60, since the LCD substrate 2 is not slipped from the stage 53 during the transferring operation, acceleration at the time of transferring can be largely increased.

In expanding and retracting the arms, the conventional necessary transferring time was 3 seconds. According to the above embodiment, in expanding and retracting the arms 51 and 52, the necessary transferring time can be shortened to 1.5 seconds. Moreover, in rotating the base, the conventional necessary transferring time was 2 seconds. According to the above embodiment, in rotating the base 49, the necessary transferring time can be shorten to 1 second. As a result, the conventional total necessary time, which is from the time when the LCD substrate 2 mounted on the stage 53 till the LCD substrate 2 is delivered to the next processing device, was 105 seconds. However, if the transferring device 60 of the above embodiment is applied to the same transferring path, the total necessary time can be shortened to 90 seconds.

Moreover, according to the transferring device 60 of the above embodiment, the positional difference of the LCD substrate 2 from the home position can be simultaneously rectified. Due to this, it is unnecessary to rectify the positional difference of the LCD substrate 2 every time the LCD substrate 2 is transferred.

The parallel link 65 of the above embodiment may be moved together with the stage 53 by the first driving motor (not shown).

Also, the first holding assembly 55 may be moved similar to the second holding assembly 57.

Moreover, not only corners 2a and 2b of the LCD substrate 2 but also other corners 2c, 2d may be held by the push members, respectively. Also, it is possible to hold three corners 2a, 2b, and 2c by push members to rectify the positional difference of the LCD substrate 2.

Figure 12:
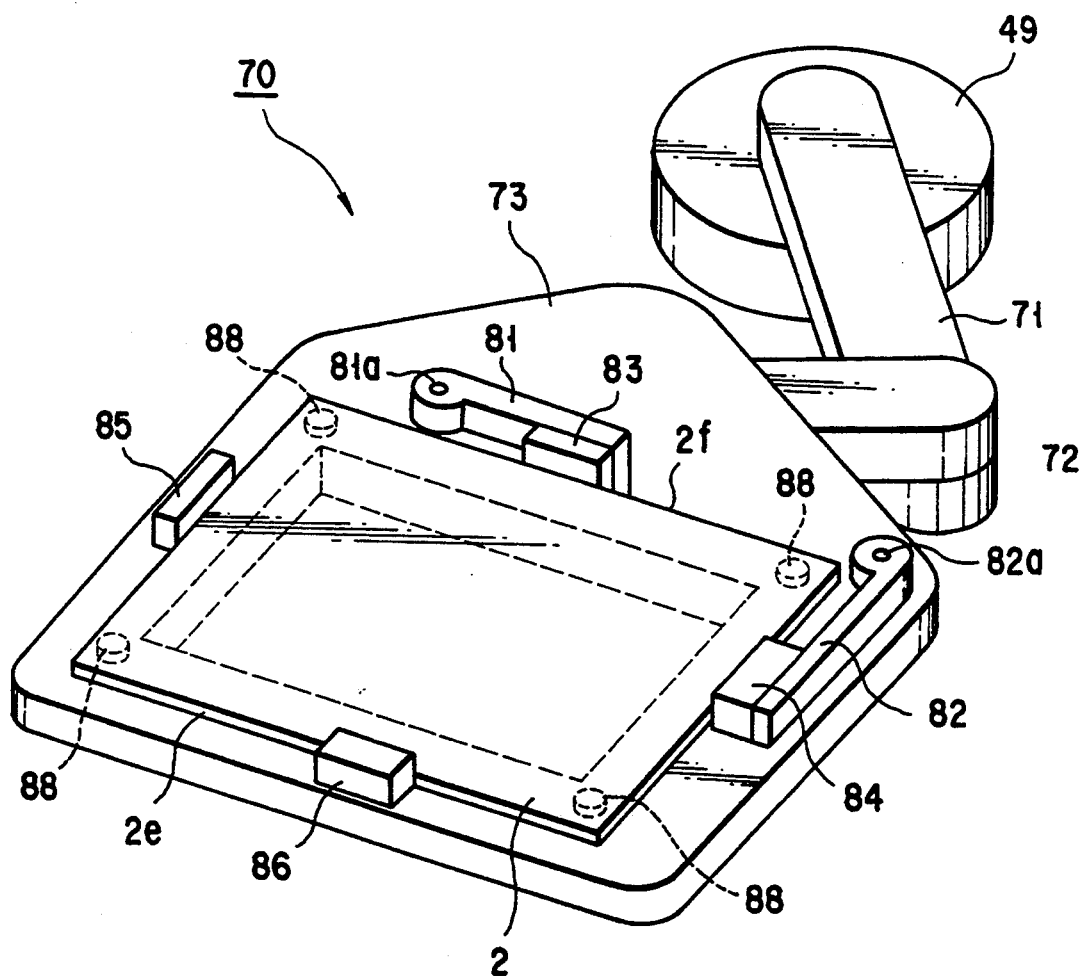
FIG. 12 is a perspective view showing the substrate transferring device having the positional difference rectifying assembly of a third embodiment.

A third embodiment of the present invention will be explained with reference to FIG. 12.

Two pairs of push members 81, 82 and stoppers 85 and 86 are provided on a stage 73 of a transferring device 70. That is, one pair of the push member 81 and stopper 85 are attached to the position where these members are in contact with the end surface of the long side of the LCD substrate 2, and other pair of push member 82 and stopper 85 are attached to the position where these members are in contact with the end surface of the long side of the LCD substrate 2, respectively.

The push member 81 is held to be rocked in the plane of the stage 73 on a shaft 81a as a center, and the push member 82 is held to be rocked in the plane of the stage 73 on a shaft 82a as a center. Rotation force is applied to these shafts 81a and 82a by driving means (not shown). Moreover, shoes 83 and 84 made of silicon rubber are attached to the contacting surface against the end surface of the LCD substrate of the respective push members 81 and 82. The stoppers 84 and 85 are also made of silicon rubber.

Additionally, supporting projections 88, which are made of silicon rubber, are formed in the four corners of the upper surface of a stage 73, respectively. The LCD substrate 2 is held by these supporting projections 88.

According to the transferring device 70, since the LCD substrate 2 is surely held by the push members 81, 82, and stoppers 85 and 86, the LCD substrate 2 is not moved on the stage 73 even if the transferring acceleration and deceleration are large. Therefore, the conventional necessary arm expanding and retracting time was 3 seconds. According to the above embodiment, the necessary arm expanding and retracting time can be shorten to 1.5 seconds. Moreover, in rotating the base, the conventional necessary time was 2 seconds. According to the above embodiment, in rotating the base 49, the necessary time can be shortened to 1 second. Moreover, in the conventional device, necessary time, which is from the time when the LCD substrate 2 is mounted on the stage 73 till the LCD substrate 2 is delivered to the next processing device, was 105 seconds. According to the device of the above embodiment, such a necessary time can be shortened to 90 seconds.

Moreover, according to the above embodiment, since the stopper 85 and 86 are fixed to the predetermined position on the stage 73, the LCD substrate 2 can be specified at a desirable position. Therefore, it is unnecessary to rectify the positioning of the LCD substrate 2, so that the entire transferring time can be shortened.

A fourth embodiment of the present invention will be explained with reference to FIG. 13.

A transferring device 90 comprises a first arm 91, a second arm 92, and a stage 93. These members 91, 92 and 93 are interlocked each other by a rotation shaft (not shown). The first arm 91 is connected to the first driving motor (not shown). The base 49 is connected to the second driving motor, and can be rotated separately from the members 91, 92, and 93.

A pulley 96 is provided on the upper surface of the stage 93. The pulley 96 is an elliptic plate cam. A timing belt 95 is stretched across the pulley 96 and a pulley 94. A groove is formed in the peripheral surface of the pulley 94 to prevent the timing belt 95 from being slipped. The shaft of the pulley 94 is connected to driving means (not shown).

A push member 99 and a pin 97 are provided on the upper surface of the pulley 96. The shaft of the push member 99 is coaxial with the shaft of the pulley 96. The push member 99 is urged to be moved by a compression spring 101, and its surface 99a is pushed to contact the end surface of the long side of the LCD substrate 2. The pin 97 is used to separate the push member 99 from the LCD substrate 2.

Two stoppers 102 are provided on the stage 93 to be faced to the push member 99. That is, the LCD substrate 2 is held between the push member 99 and the stoppers 102. The contact surface 99a of the push member 99 and the stoppers 102 are formed of soft silicon rubber.

Figure 14:
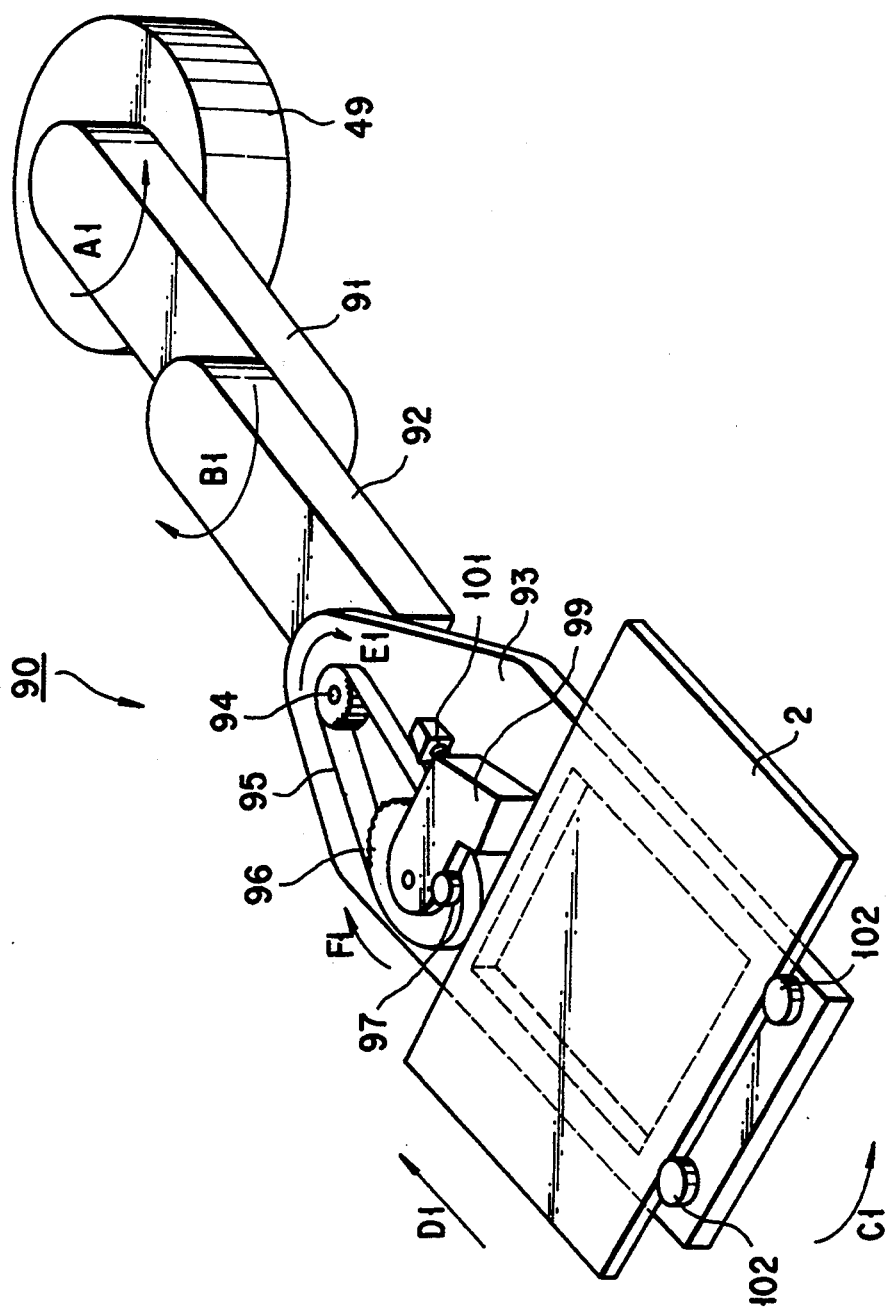
FIG. 14 is a perspective view showing the substrate transferring device having the positional difference rectifying assembly of the fourth embodiment in a state that the arm is expanded and pushed by push member

With reference to FIGS. 14 and 15, the following will explain the case that the LCD substrate 2 is transferred by use of the transferring device 90.

The arm 91 is rotated in the direction A2 in the drawing by the first driving motor such that the stage 93 is moved to the LCD substrate 2 in the auto-loader chamber 13. As shown in FIG. 14, the arms 91 and 92 linearly extend to the stage 93. At this time, the push member 99 is pushed to the side of a spring 101 by the pin 97.

Under this state, the LCD substrate 2 is mounted on the stage 93. Then, the first arm 91 is rotated in the direction A1 in the drawing such that the stage 93 is moved in the direction D1 in the drawing.

At the same time, if the shaft 94 is rotated in the direction E1 in the drawing, the pulley 96 is rotated in the direction F1 in the drawing, the pin 97 is separated from the push member 99. As a result, the push member 99 is pushed to contact the LCD substrate 2 by the spring 101.

The LCD substrate 2 is firmly held on the stage 93 from the time when the LCD substrate 2 is mounted on the stage 93 until the pin 97 is separated from the push member 99. However, since the movement of the LCD substrate 2 in the direction D2 in the drawing is limited by the stopper 102, the LCD substrate 2 is not shifted on the stage 93.

Then, the base 49 is rotated in the direction G in the drawing, and the stage 93 is directed to the process chamber 15. By acceleration and deceleration of the rotation, the LCD substrate 2 receives inertial force and tends to be shifted from the home position. However, since the LCD substrate 2 is firmly held by the push member 99 and stopper 102, the LCD substrate 2 is not shifted on the stage 93.

According to the transferring device 90 of the above embodiment, the LCD substrate 2 is not shifted from the home position on the stage 93. Due to this, acceleration and deceleration at the time of transferring the LCD substrate 2 can be largely increased. As a result, as compared with the conventional device, according to the present invention, the time necessary for transferring the LCD substrate 2 can be much shortened.

A fifth embodiment of the present invention will be explained with reference to FIGS. 16, 17A and 17B.

A transferring device 110 of the fifth embodiment is structured to push the LCD substrate 2 from the upper surface side by four push members 114. The base 49, a first arm 111, a second arm 112, and a stage 113, which are the same as those of the previous embodiment.

Four push members 114 are formed on the upper surface of the stage 113. A shoe 115, which is made of silicon rubber, is attached to the surface of each of the push member 114 to be in contact with LCD substrate 2.

Figure 17A:
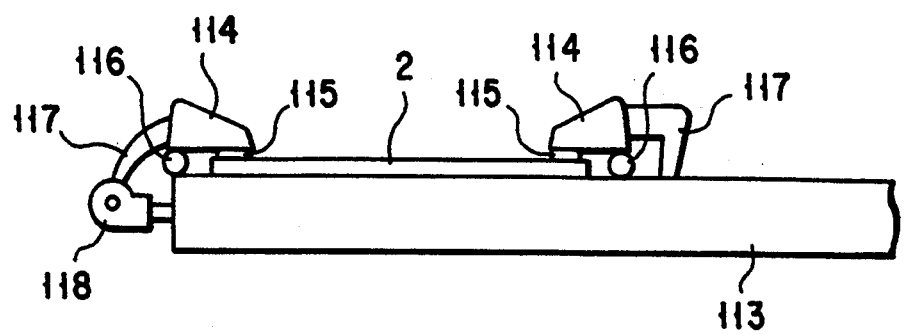
FIG. 17A is a side view showing the substrate transferring device having the positional difference rectifying assembly of the fifth embodiment in a state that the substrate is pushed by the push members.
Figure 17B:
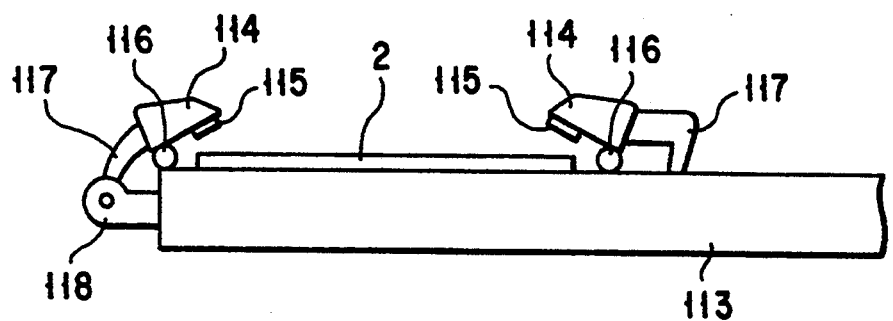
FIG. 17B is a side view showing the substrate transferring device having the positional difference rectifying assembly of the fifth embodiment in a state that the substrate is released from the push members.

As shown in FIGS. 17A and 17B, one push member 114 is held on the stage 113 by a hinge 116 and a stay 117, and the other push members 114 are held on the stage 119 by the hinge 116, stay 117, and a clevis 118. Each of hinges 116 comes in contact with the lower rear portion of the push member 114, and is used so as to rock the push member 114.

As shown in FIG. 16, a rod 120 of an air cylinder 119 may be connected to each stay 117. In other words, if the rod 120 is moved to the direction H in the drawing, each of the push members 114 is taken off the upper surface of the LCD substrate 2.

According to the transferring device 110 of the above embodiment, the LCD substrate 2 is not shifted on the stage 113 during the transferring operation, so that acceleration and deceleration during the transferring operation can be largely increased.

A transferring device 200 of a sixth embodiment of the present invention will be explained with reference to FIGS. 18 to 22.

Figure 18:
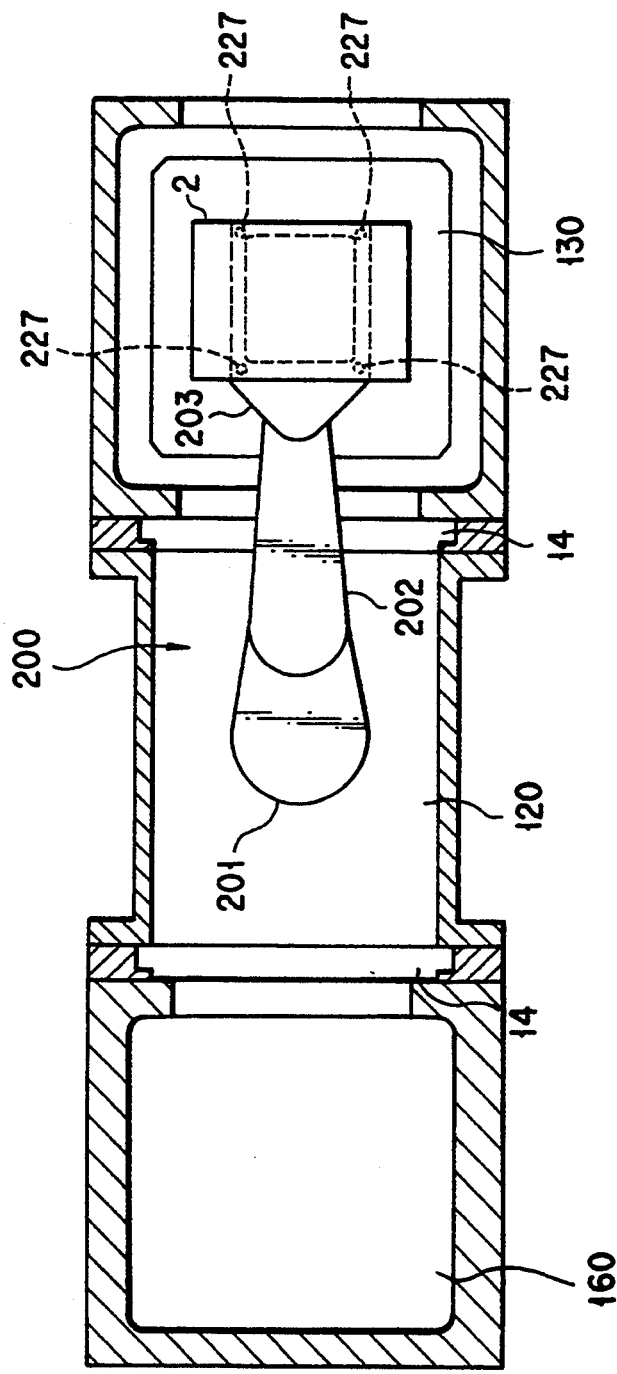
FIG. 18 is an internal plan view showing the outline of a reduced-pressure chamber system provided in the substrate transferring device according to a sixth embodiment of the present invention.

As shown in FIG. 18, the transferring device 200 is provided in a load lock chamber 120. An auto-loader chamber 130 is adjacent to one side of the load lock chamber 120 via the gate valve 14. The auto-loader chamber 130 has another gate valve (not shown) to receive the LCD substrate 2 from the external unit (not shown). A process chamber 160 is adjacent to the other side of the load lock chamber 120 via the gate valve 14. Then, etching gas is introduced into the process chamber 160 so as to etch the LCD substrate 2. The chambers 120, 130, and 160 are exhausted by an exhausting device (not shown) having a vacuum pump (not shown), respectively.

The transferring device 120 will be explained with reference to FIGS. 18 and 19.

Figure 19:
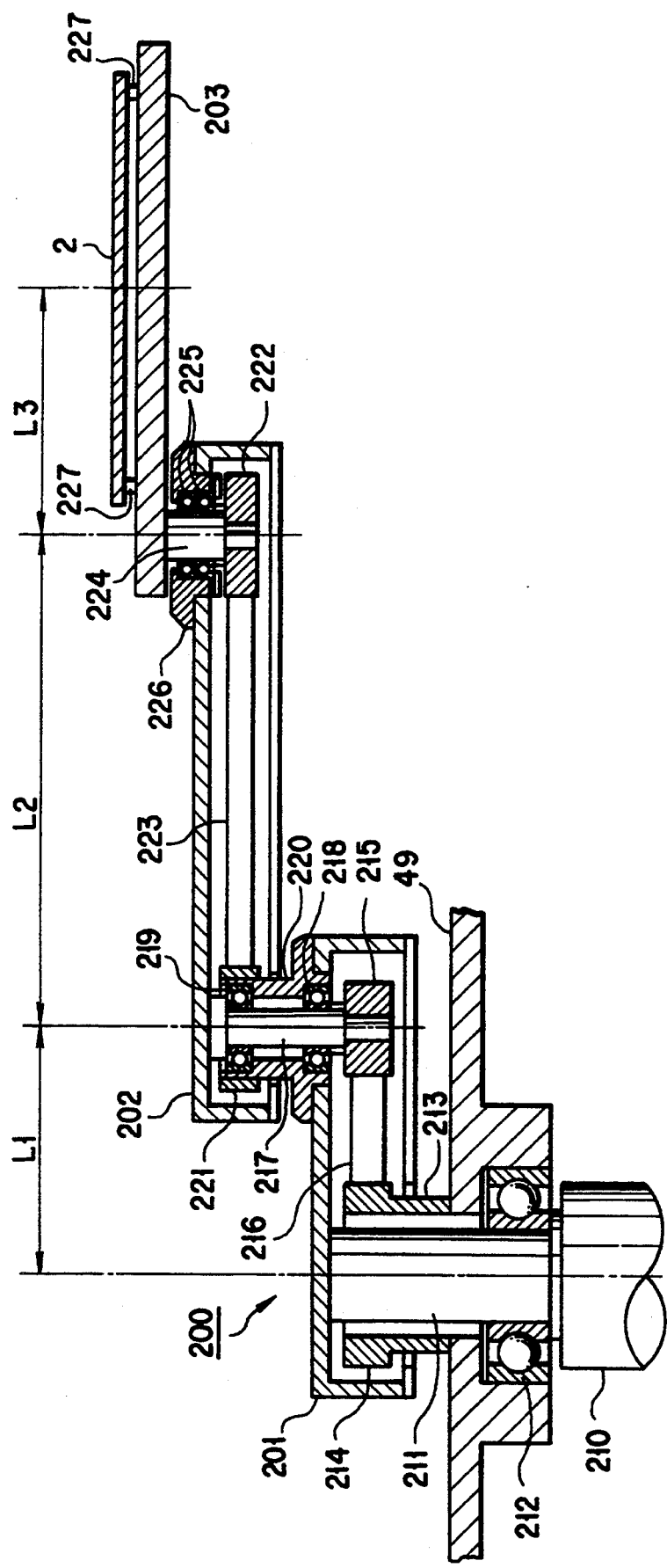
FIG. 19 is a longitudinal cross sectional view of the substrate transferring device of the sixth embodiment of the present invention.

As shown in FIG. 19, a main shaft 211 of the transferring device 200 is held on a base frame 249 by a bearing 212. The lower end of the main shaft 211 is connected to the shaft of a stepping motor 210, and the upper end is fixed to a first link 201. The first link 201 is cover-box-shaped, and a large pulley (first pulley) 214, a small pulley (second pulley) 215, and a belt 216 are contained therein. The lower portion of the large pulley 214 is connected to a post 213, and the post 213 is fixed to the base frame 249. The diameter of the large pulley 214 is twice as large as that of the small pulley 215. The large pulley 214 is provided not to interfere with the main shaft 211 and the first link 201.

A vertical shaft 217 is connected to the upper portion of the small pulley 215. The upper end of the vertical shaft 217 is connected to a second link 202. The second link 202 is cover-box-shaped, and a third pulley 221, a fourth pulley 222, and a belt 223 are contained therein.

The vertical shaft 217 is held on a post 220 via two bearings 218 and 219. The post 220 is fixed to the upper surface of the first link 201. The third pulley 221 is provided not to interfere with the perpendicular shaft 217 and the second link 202.

The third pulley 221 and fourth pulley 222, which are connected by the belt 223, have the same diameter.

A vertical shaft 224 is connected to the upper portion of the fourth pulley 222. The upper end of the vertical shaft 224 is fixed to the lower surface of the stage 203. The vertical shaft 224 is held on a post 226 via two bearings 225. The post 226 is fixed to the upper surface of the second link 202.

Figure 20:
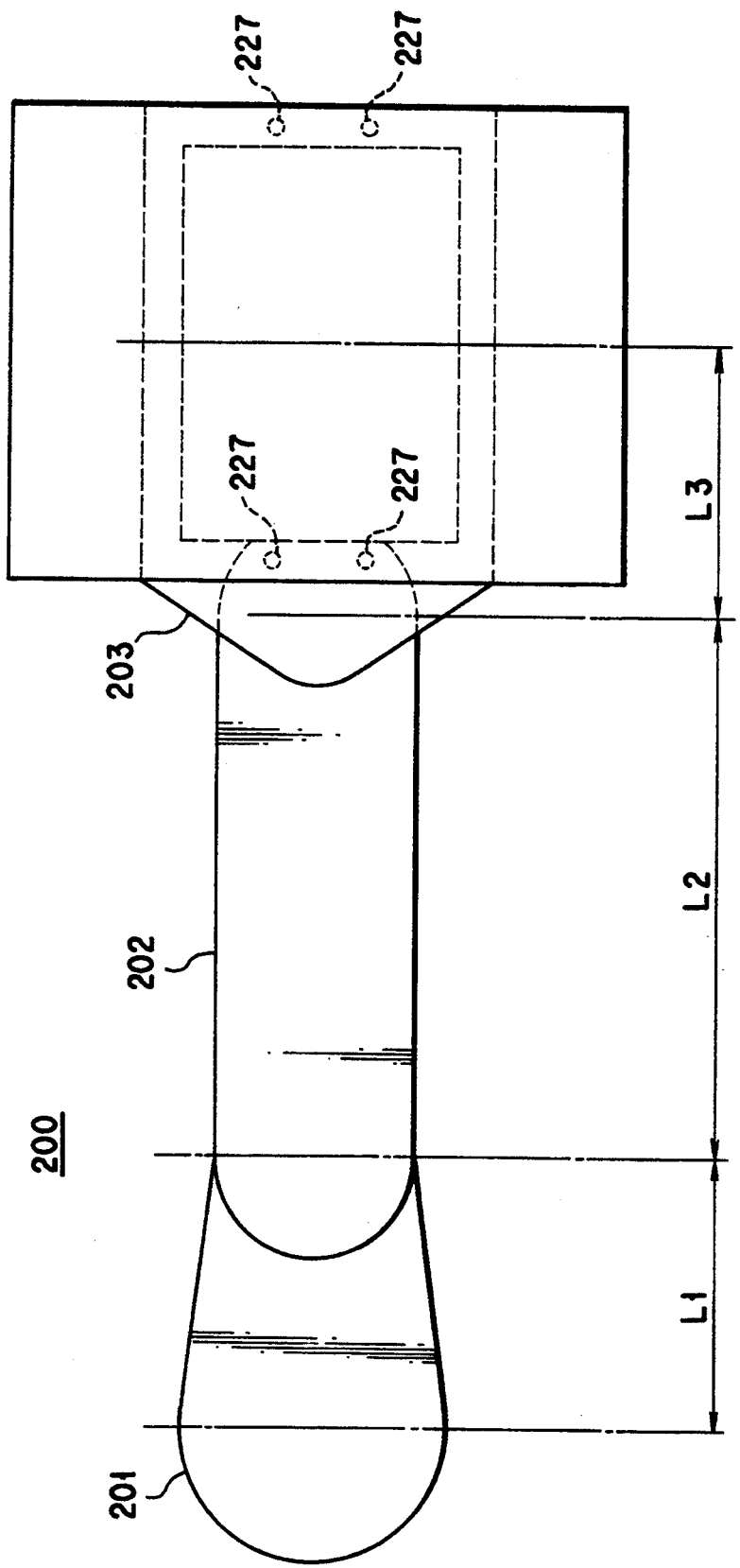
FIG. 20 is a plan view of the substrate transferring device of the sixth embodiment of the present invention.

As shown in FIG. 20, four support members 227 are formed on the upper surface of the stage 203, the LCD substrate 2 is supported by members 227. Then, the following relationship in the following equation (1) can be established:

$$L_1 : L_2 : L_3 = 1:2:1 \quad (1)$$

where the distance between the centers of the shafts 211 and 217 is $L_1$, the distance between the centers of the shafts 217 and 224 is $L_2$, and the distance between the center of the shaft 224 and the center of the stage 203 is $L_3$.

The operation of the transferring device 200 will be explained with reference to FIGS. 21A to 21E and FIG. 22.

As shown in FIG. 21A, in a state that the first link 201, second link 202, and stage 203 are linearly arranged, the LCD substrate 2 is directed right in the drawing.

As shown in FIG. 21B, if the first link 201 is rotated counterclockwise at an angle of 45 degrees by the motor 210, the LCD substrate 2 is directed in the upper right direction.

As shown in FIG. 21C, if the first link 201 is rotated counterclockwise at an angle of 90 degrees by the motor 210, the LCD substrate 2 is directed upward.

As shown in FIG. 21D, if the first link 201 is rotated counterclockwise at an angle of 135 degrees by the motor 210, the LCD substrate 2 is directed in the upper left direction.

As shown in FIG. 21E, if the first link 201 is rotated counterclockwise at an angle of 180 degrees by the motor 210, the LCD substrate 2 is directed in the left direction.

FIG. 22 shows the change (track) of the series of postures of the LCD substrate 2 during the transferring operation. In this way, according to the transferring device 200, the LCD substrate 2 after transferring can be directed in the direction opposite to the direction of the LCD substrate 2 before transferring. In other words, the LCD substrate 2 can be transferred by only one driving motor 210. At the same time, the direction of the LCD substrate 2 can be changed. Therefore, in the transfer device 200 of the above embodiment, the number of the sliding portions is smaller and the amount of dust to be generated is reduced as compared with the conventional device having two driving motors.

Moreover, as compared with the conventional device, the number of parts of the transferring device 200 can be reduced, the manufacturing cost can be reduced, and reliability can be improved.

Furthermore, according to the transferring device 200, since the width of the transferring path may be at least the length of the diagonal line of the LCD substrate 2, the capacity of the chamber can be made small. Therefore, time necessary for vacuum exhaust in the chamber can be made shorter than the conventional time.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A device for transferring a rectangular substrate under a reduced pressure atmosphere, comprising:
    a first stage on which a substrate is mounted such that a main surface of the substrate is substantially horizontal;
    a second stage arranged at a receiving/delivering position at which the substrate on the first stage is received and delivered;
    means for mounting the substrate on the second stage after transferring the substrate, together with the first stage, to said receiving/delivering position;
    rectifying means for rectifying a position of the substrate on the second stage, said rectifying means being provided on the second stage arranged in a load lock chamber in which a reduced-pressure atmosphere which is substantially the same as a process atmosphere is preliminarily generated, and said rectifying means having two pairs of rollers, for positioning each of a pair of diagonally opposite corners of the substrate between one of said pairs of rollers and the other thereof, each of said rollers pushing an end surface of said diagonally opposite corner.

2. The device according to claim 1, further comprising, moving means, provided in said rectifying means, for moving up said second stage and said rollers.

3. The device according to claim 2, further comprising, a movable base member attached to said second stage, and a lever link member extending across said movable base member and said moving means, and when said movable base member is moved up by said moving means, said movable base member is slid in a horizontal direction by said lever link member, and the rollers on said second stage push the substrate.

4. The device according to claim 3, further comprising, urging means, provided between said movable base member and said second stage, for urging said second stage to push the substrate.

5. The device according to claim 3, further comprising, urging means, provided in a movable base member of said moving means, for urging said movable base member to move downward.

6. A device according to claim 1, wherein said rectangular substrate is a glass substrate for a liquid crystal display.

7. A device according to claim 1 wherein the two pairs of rollers have a rotational axis aligned along the vertical direction.

8. A reduced-pressure chamber system comprising:
    a process chamber for providing a treatment to a substrate under reduced pressure;
    a load lock chamber that is adjacent to said process chamber;
    means for exhausting an interior of said load lock chamber; and
    a substrate transferring mechanism, provided in said load lock chamber, for transferring the substrate between the process chamber and the load lock chamber, said substrate transferring mechanism comprising:

a first stage for mounting a substrate thereupon such that a main surface of the substrate is substantially horizontal, a second stage at a receiving/delivering position at which a substrate on the first stage is received and delivered, means for mounting the substrate on the second stage after transferring the substrate together with the first stage to said receiving/delivering position, and rectifying means for rectifying a position of the substrate, said rectifying means provided on the first stage or the second stage, said rectifying means comprising first and second pairs of rollers, the first pair of rollers is for positioning end surfaces of a first corner end of the rectangular substrate so that the first corner end is between the two rollers of the first pair of rollers and the second pair of rollers is for positioning a second corner end of the rectangular substrate which is diagonally opposite to the first corner of the substrate.

9. A device according to claim 8, wherein said rectangular substrate is a glass substrate for a liquid crystal display.

10. A device according to claim 8 wherein the two pairs of rollers have a rotational axis aligned along the vertical direction.

* * * * *

UNITED STATES PATENT AND TRADEMARK OFFICE
CERTIFICATE OF CORRECTION

PATENT NO.  : 5,374,147
DATED       : December 20, 1994
INVENTOR(S) : Tsutomu HIROKI, et al.

It is certified that error appears in the above-indentified patent and that said Letters Patent is hereby corrected as shown below:

On the title page, Item [30], the first Foreign Application Priority Date is listed incorrectly. It should read:

--Jul. 29, 1992--

Signed and Sealed this

Eighteenth Day of April, 1995

*Attest:*

BRUCE LEHMAN

*Attesting Officer*  *Commissioner of Patents and Trademarks*